United States Patent
Ha et al.

(10) Patent No.: US 9,368,655 B2
(45) Date of Patent: Jun. 14, 2016

(54) SOLAR CELL AND METHOD FOR MANUFACTURING THE SAME

(75) Inventors: Jungmin Ha, Seoul (KR); Sunghyun Hwang, Seoul (KR); Junyong Ahn, Seoul (KR); Jinho Kim, Seoul (KR); Younghyun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 13/335,368

(22) Filed: Dec. 22, 2011

(65) Prior Publication Data

US 2012/0160311 A1    Jun. 28, 2012

(30) Foreign Application Priority Data

Dec. 27, 2010  (KR) .................. 10-2010-0135340
Jan. 10, 2011  (KR) .................. 10-2011-0002375

(51) Int. Cl.
*H02N 6/00*  (2006.01)
*H01L 31/00*  (2006.01)
*H01L 31/0224*  (2006.01)
*H01L 31/068*  (2012.01)

(52) U.S. Cl.
CPC ...... *H01L 31/022425* (2013.01); *H01L 31/022433* (2013.01); *H01L 31/068* (2013.01); *Y02E 10/547* (2013.01)

(58) Field of Classification Search
CPC ............. H01L 31/022425; H01L 31/068; H01L 31/022433; H01L 31/547; H01L 31/0352; H01L 31/18
USPC .................................. 136/143–265
See application file for complete search history.

(56) References Cited

U.S. PATENT DOCUMENTS

| | | | |
|---|---|---|---|
| 5,928,438 A * | 7/1999 | Salami et al. | 136/255 |
| 2005/0126620 A1 | 6/2005 | Yamasaki et al. | |
| 2010/0037941 A1 | 2/2010 | Borland et al. | |
| 2010/0132792 A1* | 6/2010 | Kim et al. | 136/258 |
| 2010/0275982 A1* | 11/2010 | Abbott et al. | 136/255 |
| 2011/0126877 A1* | 6/2011 | Kim et al. | 136/244 |
| 2011/0186116 A1 | 8/2011 | Kruemberg et al. | |

FOREIGN PATENT DOCUMENTS

| | | |
|---|---|---|
| DE | 2835136 A1 | 2/1980 |
| DE | 10392353 T5 | 5/2005 |
| DE | 102006057328 A1 | 6/2008 |
| DE | 102008052660 A1 | 3/2010 |
| JP | 4-356972 A | 12/1992 |

(Continued)

*Primary Examiner* — Tamir Ayad
*Assistant Examiner* — Uyen Tran
(74) *Attorney, Agent, or Firm* — Birch, Stewart, Kolasch & Birch, LLP

(57) ABSTRACT

A solar cell includes a substrate, an emitter region which is positioned at the substrate and having a first sheet resistance, a first highly doped region which is positioned at the substrate and having a second sheet resistance less than the first sheet resistance, a first electrode positioned at the substrate and connected to the emitter region and the first highly doped region, and a second electrode positioned at the substrate and connected to the substrate, wherein the first highly doped region crosses the first electrode and is connected to the first electrode, an upper surface of the first highly doped region is projected from an upper surface of the emitter region toward a light incident surface of the substrate, and a lower surface of the first highly doped region has the same height as a lower surface of the emitter region.

5 Claims, 20 Drawing Sheets

(56) References Cited

FOREIGN PATENT DOCUMENTS

| | | |
|---|---|---|
| JP | 2010-129872 A | 6/2010 |
| KR | 10-2009-0089526 A | 8/2009 |
| KR | 10-2010-0078813 A | 7/2010 |
| KR | 10-0997669 B1 | 12/2010 |
| WO | WO 97/13280 A1 | 4/1997 |
| WO | WO 2010/010462 A1 | 1/2010 |
| WO | WO 2010/053217 A1 | 5/2010 |

* cited by examiner

⑤ spacing between front electrodes 2.2mm(total 68)
④ spacing between front electrodes 2.4mm(total 63)
③ spacing between front electrodes 2.6mm(total 58)
② spacing between front electrodes 2.8mm(total 54)
① spacing between front electrodes 3.0mm(total 50)

SOLAR CELL AND METHOD FOR MANUFACTURING THE SAME

CROSS-REFERENCE TO RELATED APPLICATION

This application claims priority to and the benefit of Korean Patent Application Nos. 10-2010-0135340 and 10-2011-0002375, filed in the Korean Intellectual Property Office on Dec. 27, 2010 and Jan. 10, 2011, respectively, the entire contents of which are incorporated herein by reference.

BACKGROUND OF THE INVENTION (a) Field of the Invention

Embodiments of the invention relate to a solar cell and a method for manufacturing the solar cell.

(b) Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductivity types, such as a p-type and an n-type, and form a p-n junction, and electrodes respectively connected to the semiconductor parts of the different conductivity types.

When light is incident on the solar cell, electron-hole pairs are generated in the semiconductor parts. The electrons move to the n-type semiconductor part and the holes move to the p-type semiconductor part, and then the electrons and holes are collected by the electrodes connected to the n-type semiconductor part and the p-type semiconductor part, respectively. The electrodes are connected to each other using electric wires to thereby obtain electric power.

SUMMARY OF THE INVENTION

In one aspect, there is a solar cell including a substrate of a first conductivity type, an emitter region which is positioned at the substrate, is doped with impurities of a second conductivity type opposite the first conductivity type, and has a first sheet resistance, a first highly doped region which is positioned at the substrate, is doped with impurities of the second conductivity type, and has a second sheet resistance less than the first sheet resistance, a first electrode positioned at the substrate and connected to the emitter region and the first highly doped region, and a second electrode positioned at the substrate and connected to the substrate, wherein the first highly doped region extends in a direction crossing an extending direction of the first electrode and is connected to the first electrode at a crossing of the first electrode and the first highly doped region, an upper surface of the first highly doped region is projected from an upper surface of the emitter region toward a light incident surface of the substrate, and a lower surface of the first highly doped region has the same height as a lower surface of the emitter region.

The first highly doped region may be further positioned under the first electrode and along the extending direction of the first electrode, and connected to the first electrode.

The solar cell may further include a first bus bar which is positioned at the substrate, extends in a direction crossing the first electrode and is connected to the first electrode at a crossing of the first electrode and the first bus bar.

The first highly doped region may be further positioned under the first bus bar and along the extending direction of the first bus bar, and connected to the first bus bar.

The solar cell may further include a second highly doped region which is connected to the emitter region and positioned under the first electrode and along the extending direction of the first electrode, and connected to the first electrode, and wherein the second highly doped region has the second conductivity type and has a third sheet resistance less than the second sheet resistance of the first highly doped region.

The solar cell may further include a first bus bar which is positioned at the substrate, extends in a direction crossing the first electrode and is connected to the first electrode at a crossing of the first electrode and the first bus bar.

The second highly doped region may be further positioned under the first bus bar and along the extending direction of the first bus bar, and connected to the first bus bar.

The solar cell may further include an anti-reflection layer positioned on the emitter region and the first highly doped region.

The first electrode may be positioned on the anti-reflection layer except the crossing of the first electrode and the first highly doped region.

The solar cell may further include a first bus bar which extends in a direction crossing the first electrode on the anti-reflection layer and connected to the first electrode at a crossing of the first electrode and the first bus bar.

In another aspect, there is a method for manufacturing a solar cell including forming an impurity doped region at a substrate of a first conductivity type, the impurity doped region having a second conductivity type opposite the first conductivity type, etching a portion of the impurity doped region to form an emitter region and a first highly doped region, the emitter region having an impurity doped concentration different from an impurity doped concentration of the first highly doped region, and forming a first electrode which is positioned on the substrate, extends in a direction crossing the first highly doped region and connected to a portion of the first highly doped region and a second electrode which is positioned on the substrate and connected to the substrate, wherein the etched portion of the impurity doped region is formed as the emitter region and the remaining portion of the impurity doped region which is not etched is formed as the first highly doped region.

The forming of the emitter region and the first highly doped region may include forming an etch prevention layer on a portion of the impurity doped region to expose a portion of the impurity doped region, etching the exposed portion of the impurity doped region by using the etch prevention layer as a mask, and removing the etch prevention layer to form the etched portion of the impurity doped region as the emitter region and the portion on which the etch prevention layer is formed is formed as the first highly doped region.

The method may further include forming an anti-reflection layer on the emitter region and the first highly doped region, wherein the forming of the first electrode and the second electrode includes: a forming a first electrode pattern on a portion of the anti-reflection layer, a forming a second electrode pattern on the substrate, and heating the first electrode pattern and the second electrode pattern to form the first electrode connected to the first highly doped region by penetrating the portion of the anti-reflection layer and to form the second electrode connected to the substrate.

The method may further include forming an anti-reflection layer on the emitter region and the first highly doped region, wherein the forming of the first electrode and the second electrode includes: forming an etch prevention layer which has an opening exposing a portion of the anti-reflection layer on the anti-reflection layer to expose the portion of the anti-reflection layer through the opening, etching the exposed portion of the anti-reflection layer by using the etch prevention layer as a mask to expose a portion of the first highly doped region, forming a first electrode pattern on the exposed portion of the first highly doped region, forming a second electrode pattern on the substrate, and heating the first electrode pattern and the second electrode pattern to form the first electrode connected to the first highly doped region and to form the second electrode connected to the substrate.

The method may further include forming a second highly doped region which is positioned on the substrate, extend in a direction crossing the first highly doped region, and connected to the first electrode, the second highly doped region having a sheet resistance less than a sheet resistance of the first highly doped region.

The forming the emitter region, the first and second highly doped regions may include selectively forming a first etch prevention layer on the impurity doped region, forming a second etch prevention layer on the first etch prevention layer and on a portion of the impurity region on which the first etch prevention layer is not formed, etching a portion of the impurity doped region on which the second etch prevention layer is not formed by using the second and first etch prevention layers as a mask, to form a portion having an impurity doped thickness less than that of the impurity doped region, removing the second etch prevention layer, etching the portion having the impurity doped thickness less than that of the impurity doped region and a portion of the impurity doped region on which the first etch prevention layer is not formed by using the first etch prevention layer as a mask, to form the etched portion having the impurity doped thickness less than that of the impurity doped region as the emitter region and the etched portion of the impurity doped region as the first highly doped region, and removing the first etch prevention layer, to form the portion of the impurity doped region on which the first etch prevention layer is formed as the second highly doped region.

The method may further include an anti-reflection layer on the emitter region, the first highly doped region and the second highly doped region, wherein the forming of the first and second electrodes may include forming a first electrode pattern on the anti-reflection layer positioned on the second highly doped region, forming a second electrode pattern on the substrate, and heating the first electrode pattern and the second electrode pattern to form the first electrode penetrating the anti-reflection layer and connected to the second highly doped region and to form the second electrode connected to the substrate.

The forming of the emitter region, the first and second highly doped regions may include selectively forming a first etch prevention layer on the impurity doped region to expose a portion of the impurity doped region, etching the exposed portion of the impurity doped region by using the first etch prevention layer as a mask, to form the etched portion of the impurity doped region as the emitter region and a remaining portion of the impurity doped region which is not etched as the second highly doped region, and irradiating laser beams on a portion of the emitter region to form the portion of the emitter region on which the laser beams are irradiated as the first highly doped as the first highly doped region.

The forming of the emitter region, the first and second highly doped regions may include selectively forming a first etch prevention layer on the impurity doped region to expose a portion of the impurity doped region, etching the exposed portion of the impurity doped region by using the first etch prevention layer as a mask, to form the etched portion of the impurity doped region as the emitter region and a remaining portion of the impurity doped region which is not etched as the second highly doped region, and selectively forming an impurity film containing impurities of the second conductivity type on the emitter region, and heating the impurity film to form a portion of the emitter region on which the impurity film is formed as the first highly doped region.

The forming of the emitter region, the first and second highly doped regions may include selectively forming a first etch prevention layer on the impurity doped region to expose a portion of the impurity doped region, etching the exposed portion of the impurity doped region by using the first etch prevention layer as a mask, to form the etched portion of the impurity doped region as the emitter region and a remaining portion of the impurity doped region which is not etched as the second highly doped region, forming a doping prevention layer on the second highly doped region and on a portion of the emitter region to exposes a remaining portion of the emitter region, and injecting impurities of the second conductivity type on a surface of the substrate on which the doping prevention layer is formed by using an ion implantation method to the exposed remaining portion of the emitter region as the first highly doped region.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings.

DETAILED DESCRIPTION OF THE EMBODIMENTS

Figure 1:
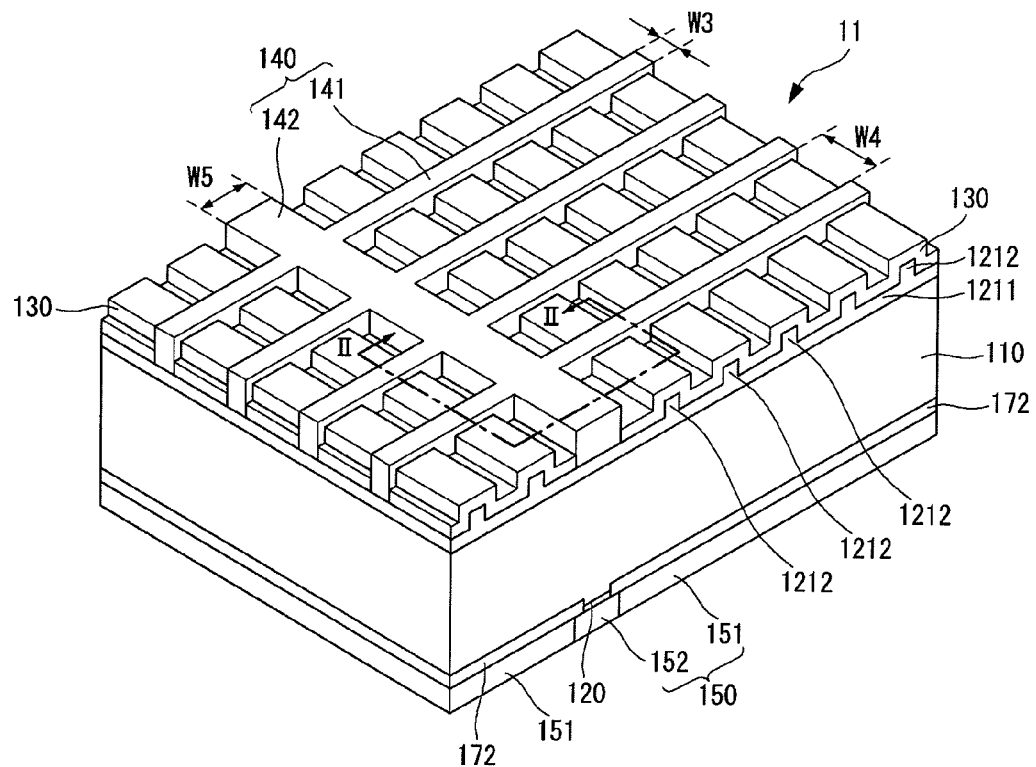
FIG. 1 is a partial sectional view of an example of a solar cell according to an example embodiment of the invention.

The invention will be described more fully hereinafter with reference to the accompanying drawings, in which example embodiments of the inventions are shown. This invention may, however, be embodied in many different forms and should not be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may be not on a portion of an edge of the other element.

Reference will now be made in detail to embodiments of the invention, examples of which are illustrated in the accompanying drawings.

Figure 2:
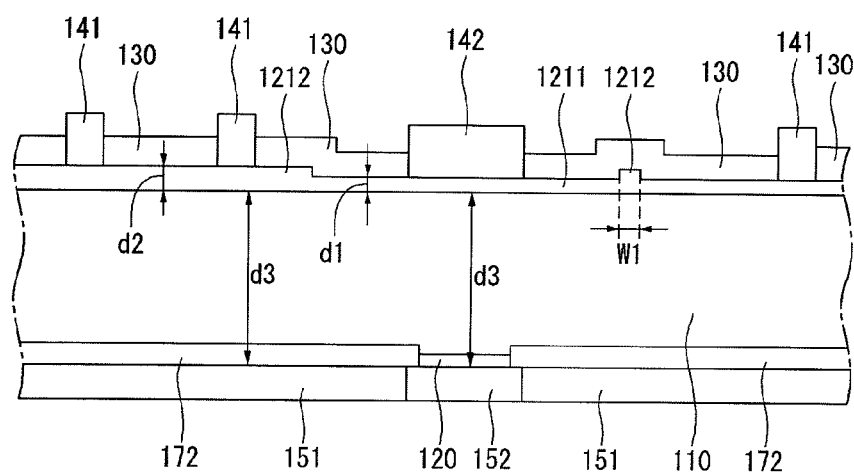
FIG. 2 is a cross-sectional view taken along line II-II of FIG. 1.

As shown in FIGS. 1 and 2, a solar cell 11 according to an example embodiment of the invention includes a substrate 110, an emitter region 1211 positioned on (or at) an incident surface [hereinafter, referred to as 'a front surface (a first surface)'] of the substrate 110 on which light is incident, a plurality of highly doped regions 1212 positioned on (or at) the front surface of the substrate 110 and connected to the emitter region 1211, an anti-reflection layer 130 positioned on the emitter region 1211 and the highly doped region 1212, an front electrode part (a first electrode part) 140 connected to the emitter region 1211 and including a plurality of front electrodes (a plurality of first electrodes) 141 and a plurality of front bus bars (a plurality of first bus bars) 142, a back electrode part (a second electrode part) 150 positioned on (or at) a surface [hereinafter, referred to as 'a back surface (a second surface)'] of the substrate 110 opposite the front surface of the substrate 110 and including a back electrode (a second electrode) 151 and a plurality of back bus bars (a plurality of second bus bars) 152, and a back surface field (BSF) region 172 positioned on (or at) a portion of the back surface of the substrate 110, and which is in contact with the back electrode part 150.

The substrate 110 is a semiconductor substrate formed of, for example, first conductivity type silicon, such as p-type silicon, though not required. Silicon used in the substrate 110 may be single crystal silicon. When the substrate 110 is of a p-type, the substrate 110 is doped with impurities of a group III element such as boron (B), gallium (Ga), and indium (In). Alternatively, the substrate 110 may be of an n-type. When the substrate 110 is of the n-type, the substrate 110 is doped with impurities of a group V element such as phosphor (P), arsenic (As), and antimony (Sb).

Unlike FIGS. 1 and 2, in an alternative example, the front surface of the substrate 110 has an uneven surface, that is, a textured surface having a plurality of projections and a plurality of depressions. In this instance, the emitter region 1211, the highly doped region 1212 and an anti-reflection layer 130 which are positioned at the front surface of the substrate 110 also have the uneven surfaces, respectively.

The textured surface may be obtained by a separate process performed on a substantially flat front surface of the substrate 110. For example, the separate process that is performed may be a saw damage removing process or a texturing process. The saw damage removing process removes a saw damage portion that occurs during a slicing process for obtaining a substrate for a solar cell from a silicon ingot by using HF etc., and the texturing process is performed after the saw damage removing process has been performed by using a dry etching method or a wet etching method.

As described above, when the front surface of the substrate 110 is textured, an incident area of the substrate 110 increases and a light reflectance decreases because of a plurality of reflection operations resulting from the textured surface. Hence, an amount of light incident on the substrate 110 increases, and the efficiency of the solar cell 11 is improved.

The emitter region 1211 is a region obtained by doping the substrate 110 with impurities of a second conductivity type (for example, n-type) opposite the first conductivity type (for example, p-type) of the substrate 110, so as to be an n-type semiconductor, for example. The emitter region 1211 is positioned at the front surface of the substrate 110 on which light is incident. The emitter region 1211 of the second conductivity type forms a p-n junction along with a first conductivity type region of the substrate 110.

A plurality of electron-hole pairs are produced by light incident on the substrate 110 and the electrons and holes move to an n-type semiconductor region and a p-type semiconductor region, respectively, by a built-in potential difference resulting from the p-n junction between the substrate 110 and the emitter region 1211. Thus, when the substrate 110 is of the p-type and the emitter region 1211 is of the n-type, the holes move to the back surface of the substrate 110, and the electrons move to the emitter region 1211.

Because the emitter region 1211 forms the p-n junction along with the substrate 110 (i.e., a first conductivity region of the substrate 110), the emitter region 1211 may be of the p-type when the substrate 110 is of the n-type unlike the example embodiment described above. In this instance, the electrons move to the back surface of the substrate 110 and the holes move to the emitter region 1211.

Returning to the example embodiment of the invention, when the emitter region 1211 is of the n-type, the emitter region 1211 may be formed by doping the substrate 110 with impurities of a group V element such as P, As, and Sb. On the contrary, when the emitter region 1211 is of the p-type, the emitter region 1211 may be formed by doping the substrate 110 with impurities of a group III element such as B, Ga, and In.

Each of the highly doped regions 1212 is an impurity doped region that is more heavily doped than the emitter region 1211 with impurities of the same conductivity type (i.e., the second conductivity type) as the emitter region 1211. Thereby, an impurity doped concentration of the emitter region 1211 is different from an impurity doped concentration of the highly doped region 1212 and, for example, the impurity doped concentration of the highly doped region 1212 is more than the impurity doped concentration of the emitter region 1211. In this example, the highly doped region 1212 also forms the p-n junction with the substrate 110.

Further, the emitter region 1211 has a different impurity doped thickness from that of the highly doped region 1212. For example, an impurity doped thickness of the emitter region 1211 is less than the impurity doped thickness of the highly doped region 1212.

The impurity doped thickness of the emitter 1211 may be substantially 0.5 μm to 0.7 μm, and the impurity doped thickness of the highly doped region 1212 may be substantially 0.6 μm to 0.8 μm. The impurity doped concentration of the emitter region 1211 may be substantially $4 \times 10^{19}/cm^3$ to $6 \times 10^{19}/cm^3$ and the impurity doped concentration of the highly doped region 1212 may be substantially $9 \times 10^{19}/cm^3$ to $4 \times 10^{20}/cm^3$.

As described above, the emitter region 1211 and the highly doped region 1212 have the different impurity doped thicknesses from each other. Thereby, a shortest distance (i.e., a thickness) between a surface (i.e., an upper surface of the emitter region 1211) of the substrate 110 and a p-n junction surface (i.e., a lower surface of the emitter region 1211) (a first junction surface) between the highly doped region 1212 and the substrate 110 is different from a shortest distance (i.e., a thickness) between the surface (i.e., an upper surface of the highly doped region 1212) of the substrate 110 and a p-n junction surface (i.e., a lower surface of the highly doped region 1212) (a second junction surface) between the highly doped region 1212 and the substrate 110. For example, as shown in FIGS. 1 and 2, the shortest distance (thickness) d1 from the surface of the substrate 110 and to the first junction surface is less than the shortest distance (thickness) d2 between the surface of the substrate 110 and the second junction surface.

The first and second junction surfaces in the substrate 110 are position on the same level (i.e., the same height). Thereby, a shortest distance d3 from the back surface of the substrate 110 to the first junction surface is equal to a shortest distance d3 from the back surface of the substrate 110 and the second junction surface. When the front surface of the substrate 110 is the textured surface and the shortest distances d1, d2 and d3 exist within an error range (or an error margin) due to the height difference of the projections of the textured surface, the shortest distances d1, d2 and d3 are considered as the same distance.

As shown in FIGS. 1 and 2, the upper surface of the highly doped region 1212 is projected from the upper surface of the emitter region 1211 to the incident surface of the solar cell 11 and lower surfaces of the highly doped region 1212 and the emitter region 1211 are positioned at the same height.

By the impurity doped thickness difference between the emitter region 1211 and the highly doped region 1212, the emitter region 1211 and the highly doped region 1212 have different sheet resistances from each other. In general, since the sheet resistance is in inverse proportion to the impurity doped thickness, the sheet resistance of the emitter region 1211 is greater than the sheet resistance of the highly doped region 1212. For example, the sheet resistance of the emitter region 1211 may be about 90 Ω/sq. to 140 Ω/sq., and the sheet resistance of the highly doped region 1212 may be about 10 Ω/sq. to 30 Ω/sq.

Figure 3:
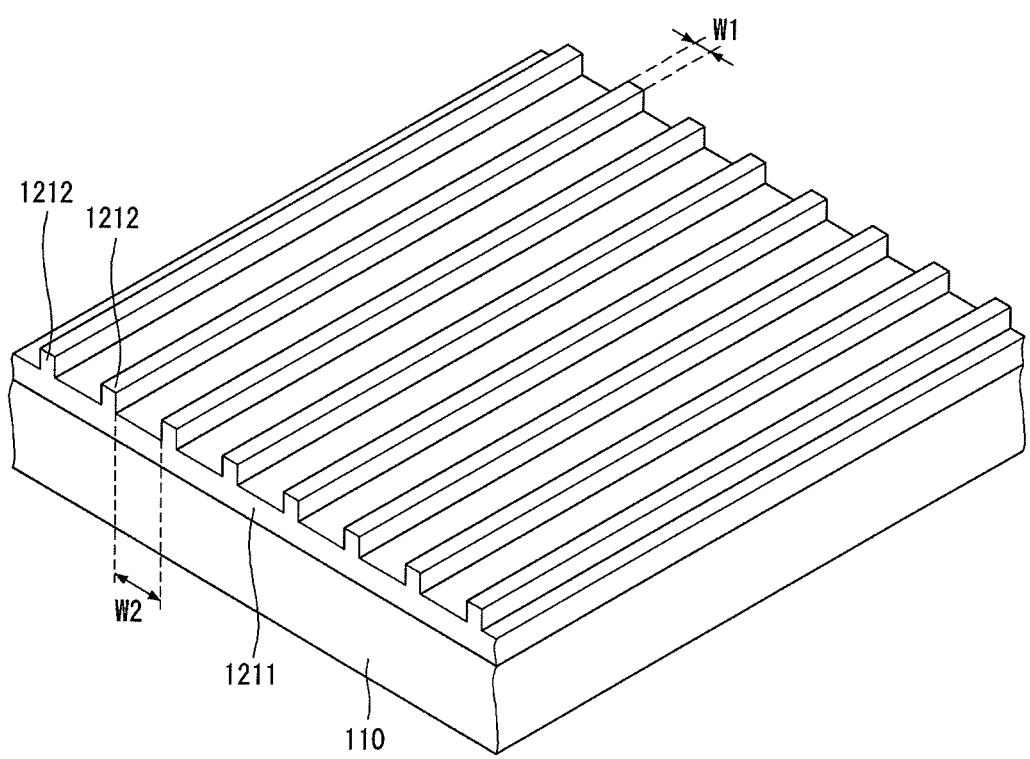
FIG. 3 is a partial sectional view of an emitter region and a highly doped region according to an example embodiment of the invention.

As shown in FIGS. 1 and 3, the plurality of highly doped region 1212 that are more heavily doped than the emitter region 1211 extend substantially parallel to one another in a predetermined direction at a distance therebetween in the substrate 110. Thereby, each highly doped region 1212 has a stripe shape. In FIGS. 1 and 2, each highly doped region 1212 intersect the plurality of front electrodes 141 and is connected to the plurality of front electrodes 141 at the crossings of the highly doped region 1212 and the plurality of front electrodes 141.

A width W1 of each highly doped region 1212 may be about 30 μm to 50 μm, a distance W2 between two adjacent highly doped regions 1212 may be about 0.6 mm to 0.7 mm. The number of the plurality of highly doped regions 1212 may be about 200 to 245. In this example, a size of the substrate 110 for a solar cell is 156 mm×156 mm. The plurality of highly doped regions 1212 are positioned at about 4% to 8% of the entire front surface of the substrate 110.

When the electrons and holes move under the influence of the p-n junction between the first conductivity region of the substrate 110 and an impurity doped region (that is, the emitter region 1211 and the highly doped regions 1212) which is of the second conductivity type, a movement direction of the charges and a loss amount of the charges due to the impurities are varied by the emitter region 1211 and the plurality of highly doped regions 1212 which have the different sheet resistances and the impurity doped concentrations from each other. That is, a region having a lower sheet resistance has a higher conductivity than a region having a greater sheet resistance, and as the impurity doped concentration increases, the conductivity increases. However, as the impurity doped concentration increases, the loss amount of the charges due to the impurities increases.

Thus, when the charges (e.g., electrons) move to the impurity doped region 1211 and 1212, charges positioned in the emitter region 1211 having a higher sheet resistance move to the highly doped regions 1212 and positioned close to the charges and having a lesser sheet resistance and. In this example, since the impurity doped concentration of the emitter region 1211 is less than that of the highly doped region 1212, the loss amount of the charges by the impurities largely decreases when the charges move from the emitter region 1211 to the highly doped regions 1212, as compared with when the charges move through the highly doped region 1212.

When the charges positioned in the emitter region 1211 move to the highly doped region 1212, the charges transferred to the highly doped regions 1212 move along the highly doped regions 1212 in a predetermined direction since the conductivity of each highly doped region 1212 is larger than the conductivity of the emitter region 1211. Thereby, the highly doped regions 1212 function as semiconductor electrodes or semiconductor channels transferring the charges.

Further, the emitter region 1211 moves the charges to the front electrode part 140 and/or to the highly doped region 1212 for eventual transfer to the front electrode part 140.

Since portions of the emitter region 1211 are in contact with the front electrode part 140 and the front electrode part 140 contains a metal, the conductivity of the front electrode part 140 is larger than the highly doped region 1212 as well as the emitter region 1211. Thus, charges existing in the portions of the emitter region 1211 contacting the front electrode part 140 or charges existing near the front electrode part 140 are directly moved to the front electrode part 140.

By the formation of the highly doped region 1212, charges moving toward the emitter region 1211 and the highly doped region 1212 under the influence of the p-n junction then transfer to the highly doped region 1212 as well as the front electrode part 140, and thereby, the movement distances of the charges decrease. Accordingly, the loss amount of the charges that occur during the movement of the charges to the front electrode part 140 or the highly doped region 1212 are reduced, and thereby, an amount of charges transferred to the front electrode part 140 increases.

When the sheet resistance of the emitter region 1211 is equal to or less than about 140 Ω/sq., or the impurity doped thickness of the emitter region 1211 is equal to or more than about 0.5 μm, a shunt error is prevented, which the front electrode part 140 penetrates the emitter region 1211 and contacts the substrate 110. When the sheet resistance of the emitter region 1211 is equal to or more than about 90 Ω/sq., or the impurity doped thickness of the emitter region 1211 is equal to or less than about 0.7 μm, an amount of light absorbed into the emitter region 1211 is decreased, and thereby, an amount of light incident upon the substrate 110 increases and a loss amount of charges by the impurities is further reduced.

When the sheet resistance of the highly doped region 1212 is equal to or less than about 300 Ω/sq., or the impurity doped thickness of the highly doped region 1212 is equal to or more than about 0.6 μm, the conductivity of the highly doped region 1212 is stably secured to increase an amount of charges moving to the highly doped region 1212, and when the sheet resistance of the highly doped region 1212 is equal to or more than 10 Ω/sq., or the impurity doped thickness of the highly doped region 1212 is equal to or less than about 0.8 μm, the conductivity of the highly doped region 1212 is stably secured to increase an amount of charges moving to the highly doped region 1212, an amount of light absorbed in the highly doped region 1212 is reduced, and thereby, an amount of light incident on the substrate 110 increases.

When the number of the plurality of highly doped regions 1212 positioned at the front surface of the substrate 110 is equal to or more than 200, a charge transfer efficiency by the highly doped regions 1212 functioning as the semiconductor electrodes or the semiconductor channels is stably obtained, and when the number of the plurality of highly doped regions 1212 is equal to or less than 245, the stable charge transfer efficiency is obtained, but yet, an increase in the loss amount of charges that could be caused by the impurities of a highly doped area of the highly doped regions 1212 is not largely increased.

When the formation area ratio of the highly doped regions 1212 is equal to or more than about 4%, the charge transfer efficiency obtained by using the highly doped regions 1212 as the semiconductor electrodes or the semiconductor channels is stably guaranteed, and when the formation area ratio of the highly doped regions 1212 is equal to or less than about 8%, the stable charge transfer efficiency is obtained without the increment of the loss amount of charges due to the highly doped area of the highly doped regions 1212.

The anti-reflection layer 130, as shown in FIGS. 1 and 2, is positioned only on the emitter region 1211 and the highly doped regions 1212, and is not positioned on portions of the emitter region 1211 on which the front electrode part 140 is positioned. The anti-reflection layer 130 reduces a reflectance of light incident on the solar cell 11 and increases selectivity of a predetermined wavelength band, thereby increasing the efficiency of the solar cell 11.

The anti-reflection layer 130 is made of a material reducing or preventing reflection of light and which increases transmitting of light into the substrate 110. For example, the anti-reflection layer 130 may be made of hydrogenated silicon nitride (SiNx:H). The anti-reflection layer 130 may have a thickness of about 70 nm to 80 nm and a refractive index of about 2.0 to 2.1. Further, the anti-reflection layer 130 may be a transparent material.

When the refractive index of the anti-reflection layer 130 is equal to or greater than about 2.0, the reflectance of light decreases and an amount of light absorbed in the anti-reflection layer 130 further decreases. Further, when the refractive index of the anti-reflection layer 130 is equal to or less than about 2.1, the reflectance of light further decreases.

Further, in the embodiment of the invention, the anti-reflection layer 130 has a refractive index of about 2.0 to 2.1 between a refractive index (about 1) of air and a refractive index (about 3.6) of the substrate 110. Thus, because a refractive index in going from air to the substrate 110 gradually increases, the reflectance of light further decreases by the gradual increase in the refractive index. As a result, an amount of light incident on the substrate 110 further increases.

When the thickness of the anti-reflection layer 130 is equal to or greater than about 70 nm, an anti-reflection effect of light is more efficiently obtained. When the thickness of the anti-reflection layer 130 is equal to or less than about 80 nm, an amount of light absorbed in the anti-reflection layer 130 decreases and an amount of light incident on the substrate 110 increases. Further, in the process for manufacturing the solar cell 11, the front electrode part 140 stably and easily passes through the anti-reflection layer 130 and is stably connected to the emitter region 1211 and the highly doped regions 1212.

The anti-reflection layer 130 performs a passivation function that converts a defect, for example, dangling bonds existing at and around the surface of the substrate 110 into stable bonds using hydrogen (H) contained in the anti-reflection layer 130 to thereby prevent or reduce a recombination and/or a disappearance of carriers moving to the surface of the substrate 110. Hence, the anti-reflection layer 130 reduces an amount of carriers lost by the defect at the surface of the substrate 110.

In this example, the anti-reflection layer 130 has a single-layered structure, but the anti-reflection layer 130 may have a multi-layered structure such as a double-layered structure in other embodiments. The anti-reflection layer 130 may be omitted, if desired.

As described above, the impurity doped region into which the impurities of the second conductivity type are doped includes the emitter region 1211 and the highly doped regions 1212 each having the different sheet resistances.

In this example, the emitter region 1211 and the highly doped regions 1212 are formed by using an etching process (for example, an etch-back process). For example, after forming an impurity doped region by diffusing the impurities of an n-type or a p-type into the substrate 110, portions of the impurity doped region are etched from the surfaces of the impurity doped region. Thereby, the portions subjected by the etching process become the emitter region 1211 and the remaining portion on which the etching process is not subjected becomes the highly doped regions 1212.

In this instance, since an impurity doped concentration increases as impurities go from a p-n junction surface to (or are located closer to) a surface (that is, an upper surface) of the substrate 110, a concentration of inactive impurities increases as the inactive impurities go to (or are located closer to) the upper surface of the substrate 110. Accordingly, the inactive impurities are gathered at and around the upper surface of the substrate 110 and form a dead layer at and around the upper surface of the substrate 110. Carriers (Charges) are lost because of the inactive impurities existing at the dead layer. Impurities, which are diffused into the substrate 110 and do not normally combine with (or disperse in) the material (for example, silicon) of the substrate 110, are referred to as inactive impurities. The inactive impurities may generate defects.

However, in the example, since an upper portion of the impurity doped region is etched to form the first and second highly doped regions 1211 and 1212, the impurity doped region is removed by a desired thickness from the surface (the upper surface) of the substrate 110, and thereby, the dead layer is removed during the etch back process for forming the first and second highly doped regions 1211 and 1212. As the dead layer is removed, the recombination and/or the disappearance of carriers resulting from the impurities existing at the dead layer is prevented or reduced. In addition, since the first anti-reflection layer 130 is positioned on the emitter region 1211 through which charges move to the highly doped regions 1212, the passivation function by the first anti-reflection layer 130 is performed to decrease a loss amount of charges due to the defects during movement to the highly doped regions 1212.

The front electrode part 140 includes a plurality of front electrodes 141 and a plurality of front bus bars 142 connected to the plurality of front electrodes 141.

The plurality of front electrodes 141 are positioned at the emitter region 1211 and electrically and physically connected to the emitter region 1211, and extend substantially parallel to one another in a predetermined direction at a distance therebetween. Thereby, the anti-reflection layer 130 is not positioned under the plurality of front electrodes 141.

The front electrodes 141 are formed of at least one conductive material, for example, silver (Ag).

In this example, each front electrode 141 may have a width W3 of about 50 μm to 120 μm and a distance W4 between two adjacent front electrodes 141 may be about 1.8 mm to 2.5 mm.

When the width W3 of each front electrode 141 is equal to or greater than about 50 μm, a line resistance of each front electrode 141 is further reduced and the conductivity of each front electrode 141 further increases to stably move charges through the front electrode 141, and the front electrodes 141 are easily formed. When the width W3 of each front electrode 141 is equal to or less than about 120 μm, because the light incident area is stably obtained, prevented is a decrease in charge generation amount due to the decrement of the light incident area.

When the distance W4 between the two adjacent front electrodes 141 is equal to or greater than about 1.8 mm, the front electrode 141 stably collects the carriers because the incident area of light resulting from the front electrodes 141 is not greatly reduced. Further, when the distance W4 between the two adjacent front electrodes 141 is equal to or less than about 2.5 mm, the carriers do not move to the adjacent front electrodes because of the distance W4 is longer than the movement distance of carriers, and the loss of carriers is prevented.

Figure 4:
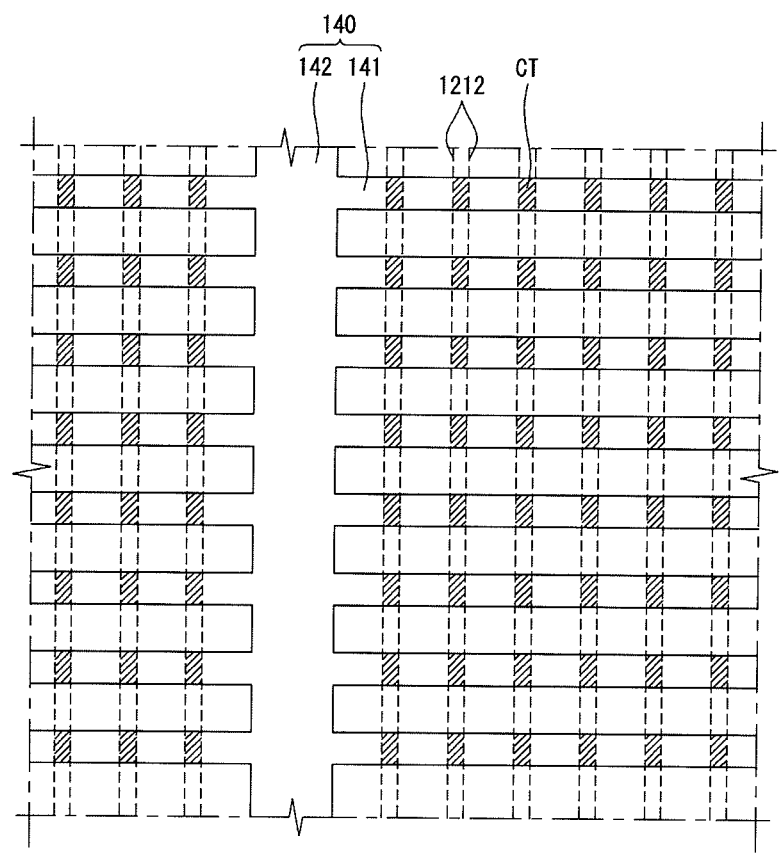
FIG. 4 is a plane view of a portion of a front electrode part and portions of the emitter region and a highly doped region underlying the front electrode part according to an example embodiment of the invention.

The plurality of front electrodes 141 extend in a crossing direction to the highly doped regions 1212 which function as the semiconductor electrodes. Thus, as shown in FIG. 4, each front electrode 141 is electrically and physically connected to the plurality of highly doped regions 1212 at portions (hereinafter, referred to as 'contact portions') CT overlapping the highly doped regions 1212.

Thereby, except the contact portions CT overlapping the plurality of highly doped regions 1212, each front electrode 141 directly contacts the emitter region 1211.

The plurality of front electrodes 141 collect carriers (e.g., electrons) moving to the emitter region 1211. Further, since the plurality of front electrodes 141 are connected to the plurality of highly doped regions 1212 at each contact portion CT, carries moving along each highly doped region 1212 are collected by the front electrodes 141 connected to the highly doped region 1212 through contact portions CT.

Since the plurality of highly doped regions 1212 are positioned in the crossing direction to the plurality of front electrodes 141 at portions at which the plurality of front electrodes 141 are not formed, the movement distances of the carriers to the electrodes (i.e., the front electrodes 141 and/or the highly doped region 1212) decrease. Thus, when the carriers move to the front electrodes 141 or the highly doped regions 1212, a loss amount of carriers (charges) by the impurities or the defects is reduced.

In addition, since the impurity doped concentration of the emitter region 1211 along which the charges mainly move to the highly doped regions 1212 is less than the highly doped regions 1212, when the charges move from the emitter region 1211 to the highly doped regions 1212, the loss amount of charges by the impurities at the emitter region 1211 decreases.

Except the crossings of the front electrodes 141 and the highly doped regions 1212, only the anti-reflection layer 130 is positioned on the plurality of the highly doped regions 1212, and thereby, the front electrode part 140 containing the metal material (e.g., Ag) and decreasing the light incident area at the front surface of the substrate 110 is not positioned on the highly doped regions 1212. Thus, the reduction of the light incident area by the plurality of the highly doped regions 1212 does not occur, and, as described above, an amount of charges moving to each front electrode 141 increases since the charge movement distance and the loss amount of charges decrease.

As described above, the width W1 of each highly doped region 1212 is about 30 μm to 40 μm. When the width W1 of each highly doped region 1212 is equal to or more than about 30 μm, the highly doped region 1212 having a desired width W1 is easily and stably formed. As the impurity doped concentration increases, a loss amount of charges by the impurities increases. Thus, when the width W1 of each highly doped region 1212 is equal to or less than about 40 μm, the loss amount of charges due to the area increase of the highly doped regions 1212 is reduced. Thus, when the width W1 of each highly doped region 1212 is equal to or less than about 40 μm, the charges stably move to the highly doped regions 1212 to improve a transfer efficiency of charges to the front electrodes 141.

When the distance W2 between the two adjacent highly doped regions 1212 is equal to or greater than about 0.6 mm, a loss amount of charges due to the impurity doped concentrations of the highly doped regions 1212 is reduced. When the distance W2 between the two adjacent highly doped regions 1212 is equal to or less than about 0.7 mm, a charge movement distance is stably compensated to decrease an amount of charges lost during movement to the highly doped regions 1212.

In this example, the number of contact portions CT contacting the plurality of the highly doped regions 1212 and the plurality of front electrodes 141 may be about 23,500 to 40,000.

When the number of the contact portions CT is equal to or more than about 23,500, an amount of charges from the highly doped regions 1212 to the front electrodes 141 is stably secured and when the number of the contact portions CT is equal to or less than about 40,00, a loss amount of charges due to an area increase of the highly doped regions 1212 decreases.

The plurality of front bus bars 142 are electrically and physically connected to the emitter region 1211 and extend substantially parallel to one another in a direction crossing an extending direction of the front electrodes 141, that is, in the same direction as an extending direction of the plurality of highly doped regions 1212. Thus, the plurality front bus bars 142 are in contact with only the emitter region 1211, not contacting the highly doped regions 1212.

The front electrodes 141 and the front bus bars 142 are electrically and physically connected to one another at crossings of the front electrodes 141 and the front bus bars 142.

As shown in FIG. 1, the plurality of front electrodes 141 have a stripe shape extending in a transverse (or longitudinal) direction, and the plurality of front bus bars 142 have a stripe shape extending in a longitudinal (or transverse direction). Thus, the front electrode part 140 has a lattice shape on the front surface of the substrate 110.

The plurality of front bus bars 142 collect not only carriers transferred from the emitter region 1211 contacting the plurality of front bus bars 142 but also the carriers collected by the plurality of front electrodes 141.

The plurality of front bus bars 142 maybe connected to an external device and maybe output the carriers (for example, electrons) collected by the front bus bars 142 to the external device.

Because the plurality of front bus bars 142 collect the carriers collected by the plurality of front electrodes 141 and move the carriers to a desired location, a width of each of the plurality of front bus bars 142 is greater than a width of each of the plurality of front electrodes 141.

Each front bus bar 142 may have a width W5 of about 1.5 mm to 2 mm.

When the width W5 of each front bus bar 142 is equal to or more than about 1.5 mm, the charge collection by the front bus bars 142 is easily performed, and when the width W5 of each front bus bar 142 is equal to or more than about 2 mm, it is possible to manufacture the front bus bars 142 to stably collect charges without a waste of a material for the front bus bars 142.

The front electrode part 140 is connected to the emitter region 1211 having a relatively low impurity doped concentration at portions of the emitter region 1211 at which charges mainly move to the front electrode part 140 and thereby, a loss amount of charges due to impurities decreases to increase mobility of charges.

Conductivity between the portions of the highly doped regions 1212 which are connected to the front electrodes 141 and each front electrode 141 increases at portions of each front electrode 141 connected to the highly doped regions 1212. Thus, an amount of charges moved from the highly doped regions 1212 to the front electrodes 141 increase to improve an efficiency of the solar cell 11.

In the example embodiment of the invention, because the anti-reflection layer 130 is formed of silicon nitride (SiNx) having a characteristic of a positive (+) fixed charge, when the substrate 110 is of the p-type, the carrier transfer efficiency from the substrate 110 to the front electrode part 140 is improved. In other words, because the anti-reflection layer 130 has the positive charge characteristic, the anti-reflection layer 130 prevents a movement of holes having positive charges.

For example, when the substrate 110 is of the p-type and the anti-reflection layer 130 has the positive charge characteristic, electrons corresponding to negative charges moving to the anti-reflection layer 130 have the polarity opposite the anti-reflection layer 130. Therefore, the electrons are drawn to the anti-reflection layer 130 due to the polarity of the anti-reflection layer 130, and the holes having the same polarity as the anti-reflection layer 130 are pushed out of the anti-reflection layer 130 due to the polarity of the anti-reflection layer 130.

Accordingly, an amount of electrons moving from the substrate 110 to the front electrode part 140 increases due to silicon nitride (SiNx) having the positive polarity, and the movement of undesired carriers (for example, holes) is efficiently prevented. As a result, an amount of carriers recombining at the front surface of the substrate 110 further decreases.

The plurality of front bus bars 142 are formed along with the plurality of front electrodes 141 and made of the same material as the plurality of front electrodes 141, but the front bus bars 142 and the front electrodes 141 may be formed by different processes from each other and made of different materials.

The back surface field region 172 is a region (for example, a pttype region) that is more heavily doped than the substrate 110 with impurities of the same conductivity type as the substrate 110.

A potential barrier is formed by a difference between impurity concentrations of a first conductivity region of the substrate 110 and the back surface field region 172. Hence, the potential barrier prevents or reduces electrons from moving to the back surface field region 172 used as a moving path of holes and makes it easier for holes to move to the back surface field region 172. Thus, an amount of carriers lost by a recombination and/or a disappearance of the electrons and the holes at and around the back surface of the substrate 110 is reduced, and a movement of carriers to the back electrode part 150 increases by accelerating a movement of desired carriers (for example, holes).

The back electrode part 150 includes the back electrode 151 and a plurality of back bus bars 152 connected to the back electrode 151.

The back electrode 151 contacts the back surface field region 172 positioned at the back surface of the substrate 110 and is positioned on the entire back surface of the substrate 110 except a formation area of the back bus bars 152. The back electrode 151 may contain a conductive material such as aluminum (Al). In an alternative example, the back electrode 151 may be not formed at an edge of the back surface of the substrate 110 as well as the formation area of the back bus bars 152.

The back electrode 151 may be made of a different material from that of the plurality of front electrodes 141, and, for example, may contain at least one conductive material such as aluminum (Al).

The back electrode 151 collects carriers (for example, holes) moving to the back surface field region 172.

Since the back electrode 151 contacts the back surface field region 172 having an impurity doped concentration heavier than the substrate 110, a contact resistance between the substrate 110 (that is, the back surface field region 172) and the back electrode 151 is reduced to improve the charge transfer efficiency from the substrate 110 to the back electrode 151.

The plurality of back bus bars 152 are positioned on the back surface of the substrate 110, on which the back electrode 151 is not positioned, and are connected to the back electrode 151.

Further, the plurality of back bus bars 152 are positioned opposite the plurality of front bus bars 142 with the substrate 110 therebetween.

The plurality of back bus bars 152 collect carriers from the back electrode 151 in the same manner as the plurality of front bus bars 142.

The plurality of back bus bars 152 may be also connected to the external device and may output the carriers (for example, holes) collected by the back bus bars 152 to the external device.

The plurality of back bus bars 152 may be formed of a material having better (or greater) conductivity than the back electrode 151. Further, the plurality of back bus bars 152 may contain at least one conductive material, for example, silver (Ag). Thereby, the plurality of back bus bars 152 may be made of a different material from the back electrode 151.

In this example, an impurity doped region 120 of the second conductivity type opposite the conductivity type of the substrate 110 are positioned at a portion of the back surface of the substrate 110 under the back bus bars 152, the impurity doped region 120 may be removed.

Alternatively, the back electrode 151 may be positioned on the entire back surface of the substrate 110. In this instance, the back bus bars 152 may be positioned on the back electrode 151 and opposite the front bus bars 142 with the substrate 110 therebetween. The back electrode 151 may be positioned on the entire back surface of the substrate 110 or on substantially the entire back surface of the substrate 110 except the edge of the back surface of the substrate 110, if necessary or desired. In this instance, the formation area of the back surface field region 172 and the back electrode 151 increases, and thereby, the back surface field effect by the back surface field region 172 is improved and an amount of charges moved to the back electrode 151 further increases.

An operation of the solar cell 11 having the above-described structure is described below.

When light irradiated to the solar cell 11 is incident on the emitter region 1211 and the highly doped regions 1212, and the substrate 110 through the anti-reflection layer 130, a plurality of electron-hole pairs are generated in the semiconductor region such as the emitter region 1211, the highly doped regions 1212 and the substrate 110 by light energy based on the incident light. In this instance, because a reflection loss of the light incident on the substrate 110 is reduced by the textured surface of the substrate 110 and the anti-reflection layer 130, an amount of light incident on the substrate 110 further increases.

By the p-n junction, the electrons and the holes of the electron-hole pairs move to the emitter region 1211 and the highly doped regions 1212 which are of the n-type and the substrate 110 which is of p-type, respectively. The electrons moving to the emitter region 1211 and the highly doped regions 1212 are collected by the the front bus bars 142 and the front electrodes 141, and then move to the front bus bars 142. The holes moving to the substrate 110 are collected by the back electrode 151 and the back bus bars 152 and then move to the back bus bars 152. When the front bus bars 142 are connected to the back bus bars 152 using electric wires, current flows therein to thereby enable use of the current for electric power.

In addition, since the plurality of highly doped regions 1212 (i.e., the semiconductor electrodes) are positioned in a direction crossing the plurality of front electrodes 141, the charges move along the highly doped regions 1212 as well as the front electrodes 141 or the front bus bars 142.

Thereby, since the movement distance it takes for the charges to move to the electrodes 141 or 1212 or the front bus bars 142 decreases, an amount of charges that move to the front electrode part 140 or the highly doped regions 1212 increases. In addition, since the highly doped regions 1212 contacting the front electrodes 141 have the high impurity doped concentration of a high conductivity, the contact resistances between the highly doped regions 1212 and the front electrodes 141 are reduced, and thereby, the charge transfer efficiency from the highly doped regions 1212 to the front electrodes 141 is improved. Accordingly, an amount of charges transferred from the impurity doped regions 1211 and 1212 to the front bus bars 142 increases and an efficiency of the solar cell 11 increases.

Next, referring to FIGS. 5A to 5E, a method for manufacturing the solar cell 11 shown in FIGS. 1 and 2 is described.

Figure 5A:
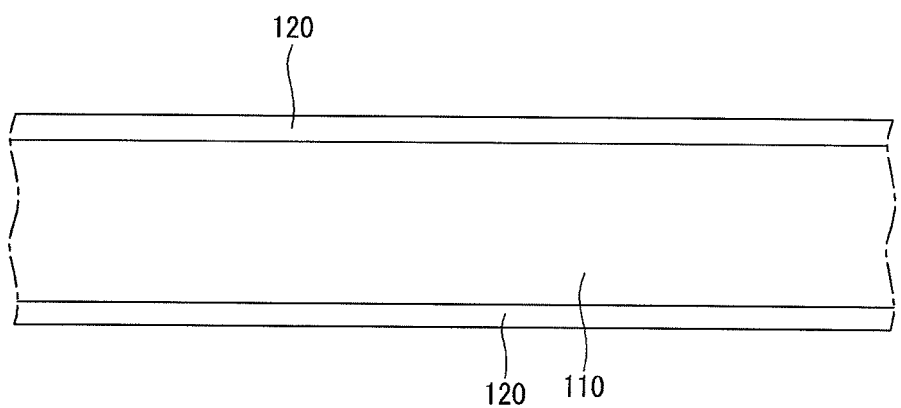
FIGS. 5A to 5E are sectional views sequentially showing processes for manufacturing the solar cell shown in FIGS. 1 and 2.

As shown in FIG. 5A, by doping of a material containing impurities of a group V element or a group III element by use of a thermal diffusion process, etc., into the substrate 110 of poly crystalline silicon or a single crystal silicon, an impurity doped region 120 is formed in the substrate 110. When the conductivity type of the substrate 110 is an n-type, the material may be a material (e.g., $POCl_3$ or $H_3PO_4$) containing phosphorous (P), and when the conductivity type of the substrate 110 is a p-type, the material may be a material (e.g., $B_2H_6$) containing boron (B). When the impurity doped region 120 is formed by the thermal diffusion process, the impurity doped region 120 may be formed in front, back and side surfaces of the substrate 110.

The impurity doped region 120 may have a sheet resistance of about 10 $\Omega$/sq., to 30 $\Omega$/sq.

Next, phosphorous silicate glass (PSG) or boron silicate glass (BSG) formed as the n-type or the p-type impurities are diffused into the inside of the substrate 110, is removed through an etching process.

If desired, before the formation of the impurity doped region 120, the entire flat front surface of the substrate 110 may be textured, to form a textured surface having a plurality of projections and a plurality of depressions. In this instance, when the substrate 110 is made of single crystal silicon, the flat front surface of the substrate 110 is textured by using a sodium hydroxide solution such as KOH or NaOH, and each projection of the textured surface may have a pyramid shape. On the other hand, when the substrate 110 is made of poly crystalline silicon, the flat front surface of the substrate 110 is textured by using an acid solution such as HF or $HNO_3$ and the textured surface of the substrate 110 may have the plurality of depression of various shapes.

Figure 5B:
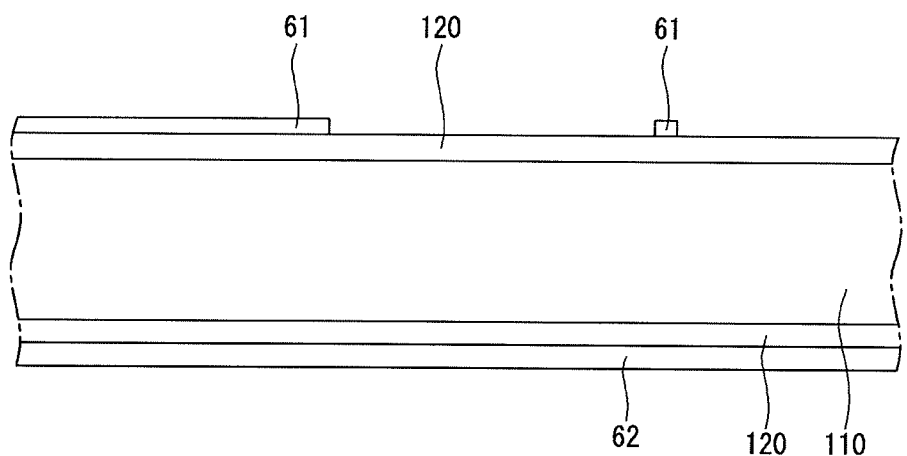
Figure 5C:
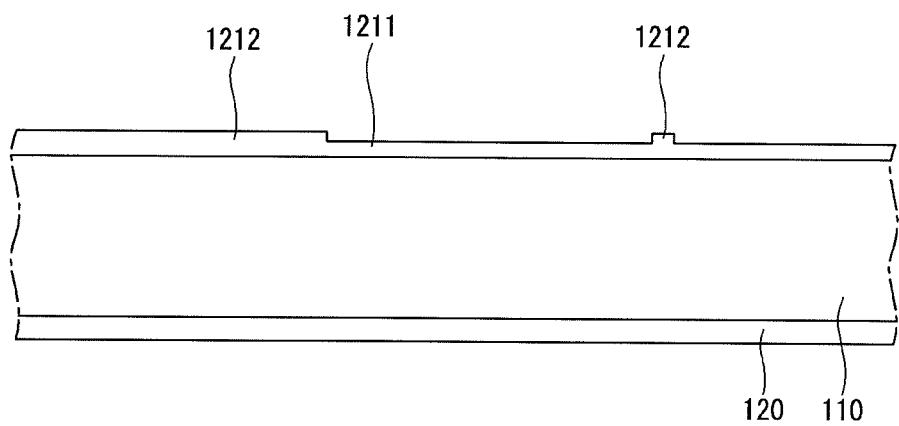

Next, as shown in FIG. 5B, a first etch prevention layer 61 is selectively or partially positioned on the impurity doped region 120 positioned at the front surface of the substrate 110 to expose portions of the impurity doped region 120, and a second etch prevention layer 62 is positioned on the entire back surface of the substrate 110. In this instance, the first etch prevention layer 161 is spaced apart from each other on the impurity doped region 120 and extended in a predetermined direction parallel to each other. The first and second etch prevention layers 61 and 62 may be formed by a screen printing method or a photo lithography method, etc.

Then, the entire substrate 110 is immersed into an etchant to partially remove the exposed portions of the impurity doped region 120. Thereby, an emitter region 1211 and a plurality of highly doped regions 1212 are formed having each different impurity doped concentrations and impurity doped thicknesses from each other. A time or a concentration, etc., of the etchant for the etching is controlled to adjust an etched amount (that is, an etched thickness) of the impurity doped region 120 for forming the emitter region 1211 and the highly doped regions 1212. Next, the first and second etch prevention layers 61 and 62 on the substrate 110 are removed.

Thus, the etched portion of the impurity doped region 120 are formed as the emitter region 1211, and the portions covered by the etch prevention layer 61 and not etched by the etchant, and which are extended in a predetermined direction spaced apart from each other, are formed as the plurality of highly doped regions 1212. Thereby, the emitter region 1211 and the highly doped regions 1212 are alternately positioned at the substrate 110.

Since the etched portion is formed as the emitter region 1211, a thickness of the emitter region 1211 is reduced, and thereby, the emitter region 1211 has the thickness less than each highly doped region 1212, and the emitter region 1211 has a sheet resistance greater than each highly doped region 1212.

Thus, charges move toward the highly doped regions 1212 of less resistance than that of the emitter region 1211. In addition, since each highly doped region 1212 has an impurity doped concentration greater than that of the emitter region 1211, the highly doped region 1212 has a conductivity greater than that of the emitter region 1211. Thereby, the charges existing at the emitter region 1211 move to the highly doped regions 1212 of the higher conductivity, and thereby, are transferred along the highly doped regions 1212. Accordingly, the charges (for example, electrons) mainly transfer along the highly doped regions 1212.

In an alternative example, the portions of the impurity doped region 120 may be etched by a dry etching method or only a front surface portion of the substrate 110 may be immersed into the etchant, to form an impurity doped portion including the emitter region 1211 and the highly doped regions 1212, in which impurities of a second conductivity type are doped. In this instance, it may be not necessary that an etch prevention layer is formed at the back surface of the substrate 110 not exposed to an etching material or the etchant.

Figure 5D:
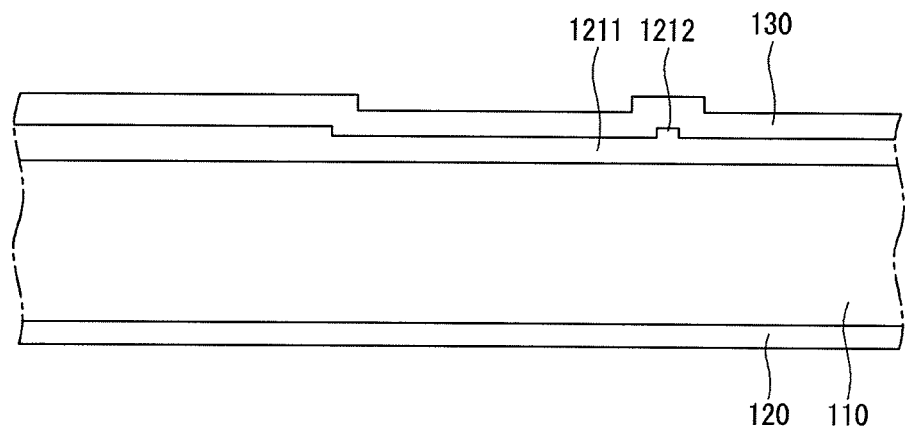

Next, as shown in FIG. 5D, by using a plasma enhanced chemical vapor deposition (PECVD) or a chemical vapor deposition (CVD), an anti-reflection layer 130 is formed on the emitter region 1211 and the highly doped regions 1212 positioned at the front surface of the substrate 110.

Figure 5E:
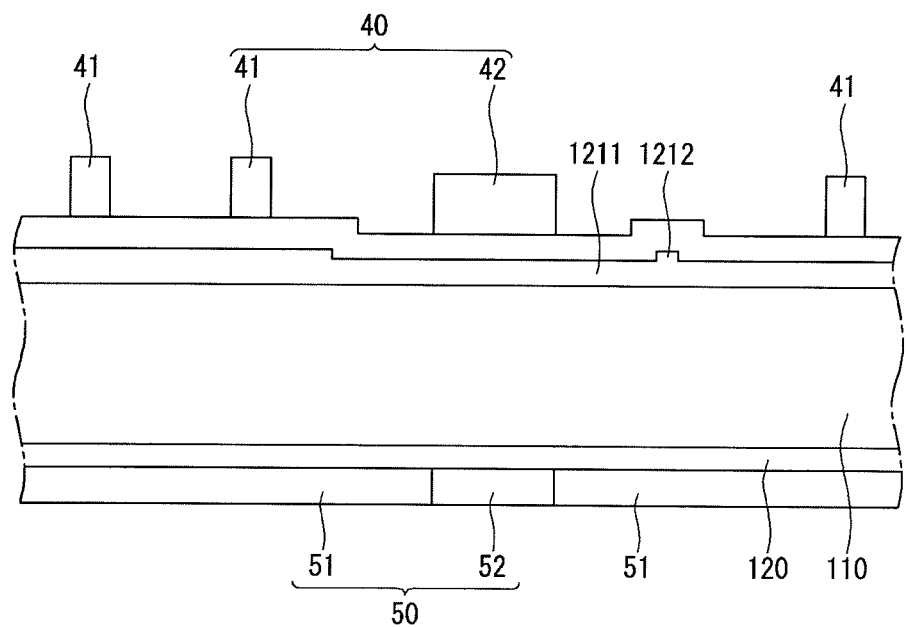

Next, as shown in FIG. 5E, by using a screen printing method, a front electrode part pattern (a first electrode part pattern) 40 is formed on a portion of the anti-reflection layer 130, and a back electrode pattern (a second electrode pattern) 51 and a back bus bar pattern (a second bus bar pattern) 52 are formed on the impurity doped region 120 formed at the back surface of the substrate 110, to complete a back electrode part pattern (a second electrode part pattern) 50.

By using a screen printing method, a paste for the front electrode part pattern 40 containing silver (Ag) is selectively or partially on the anti-reflection layer 130 and the printed paste is dried, to form the front electrode part pattern 40 on the portion of the anti-reflection layer 130. The front electrode part pattern 40 includes a front electrode pattern (a first electrode pattern) 41 and a front bus bar pattern (a first bus bar pattern) 42.

The back electrode pattern 51 is formed by selectively or partially printing a paste for the back electrode pattern 51 containing aluminum (Al) on the back surface of the substrate 110 and drying the printed paste by a screen printing method, and by using a screen printing method, the back bus bar pattern 52 is formed by printing a paste for the back bus bar patterns 52 containing silver (Ag) on portion of the back surface of the substrate 110, on which the back electrode pattern 51 is not formed and drying the printed paste. Thereby, the back bus bar pattern 52 is selectively or partially formed on the back surface of the substrate 110.

In this instance, a drying temperature of the patterns 40, 51 and 52 may range about 120° C. to 200° C. and a formation order of the patterns 40, 51 and 52 may be changed.

Next, a thermal process is applied to the substrate 110 equipped with the front electrode part pattern 40 and the back electrode part pattern 50 at a temperature of about 750° C. to 800° C. Accordingly, formed are a front electrode part 140 having a plurality of front electrodes 141 connected to the emitter region 1211 and the highly doped regions 1212 and a plurality of front electrode bus bars 142 connected to only the emitter region 1211, a back electrode part 150 having a back electrode 151 connected electrically to the substrate 110 and a plurality of back electrode bus bars 152 connected to the substrate 110 and the back electrode 151, and a back surface electric field region 172 disposed in (at) the back surface of the substrate 110 contacting the back electrode 151.

More specifically, when the thermal process is performed, the front electrode part pattern 40 passes through the anti-reflection layer 130 of contact portions with the front electrode part pattern 40 to thereby form the plurality of front electrode 141 contacting the emitter region 1211 and the highly doped regions 1212 and the plurality of front bus bars 142 contacting the front electrodes 141 and the emitter region 1211, so as to complete the front electrode part 140. In this instance, each front bus bar 142 contacts only portions of the emitter region 1211.

The front electrode pattern 41 of the front electrode part pattern 40 forms the plurality of front electrodes 141, and the front bus bar pattern 42 of the front electrode part pattern 40 forms the plurality of bus bars 142.

The plurality of front electrodes 141 extend in a direction crossing the plurality of highly doped regions 1212, and the plurality of front bus bars 142 extend in the same direction as the plurality of highly doped regions 1212 in parallel to the plurality of highly doped regions 1212. Thereby, each front electrode 141 contacts the plurality of highly doped regions 1212 at portions crossing the plurality of highly doped regions 1212 as well as the emitter region 1211 and each front bus bar 142 contacts only the corresponding portions of the emitter region 1211.

Thus, each of the plurality of front electrodes 141 collects charges transferred through the corresponding portions of the emitter region 1211 underlying each front electrode 141 and through the corresponding portions of the plurality of highly doped region 1212 contacted via the contact portions CT, and transfers the collected charges to adjacent front bus bars 142.

By the thermal process, the back electrode pattern 51 and the back bus bar pattern 52 of the back electrode part pattern 50 are formed as the back electrode 151 and the plurality of back bus bars, respectively, and aluminum (Al) contained in the back electrode pattern 51 is diffused over the impurity doped region 120 as well as the impurity doped region 120 formed on the back surface of the substrate 110 to form an impurity region, that is, the back surface field region 172, which is highly doped with an impurity of the same conductivity type as the substrate 110. In this instance, an impurity doped concentration of the back surface field region 172 is higher than that of the substrate 110. Thus, the back electrode 151 is in contact with the back surface field region 172, and thereby, is electrically connected to the substrate 110. The impurity doped region 120 also exists at a portion of the back surface of the substrate 110 on which the back electrode pattern 51 is not formed.

Moreover, in performing the thermal process, metal components contained in the patterns 40 and 50 are chemically coupled to the contacted portions 121 and 110, respectively, such that a contact resistance is reduced, and thereby, a transmission efficiency of the charges is improved to improve a current flow.

Next, an edge isolation process is performed by laser beams or an etching process to remove the impurity doped region 120 that is formed on side surfaces of the substrate 110, to thereby complete the solar cell 11. However, the time as to perform the edge isolation process may be changed, or the edge isolation process may be omitted if desired.

In this example, the impurity doped region 120 formed at (in) the back surface of the substrate 110 is not removed, but in an alternative example, the impurity doped region 120 formed at (in) the back surface of the substrate 110 may be removed by a separate process before the formation of the back electrode part pattern 50. In this instance, the solar cell 11 does not include the impurity doped region 120 at (in) the back surface of the substrate 110.

Figure 6:
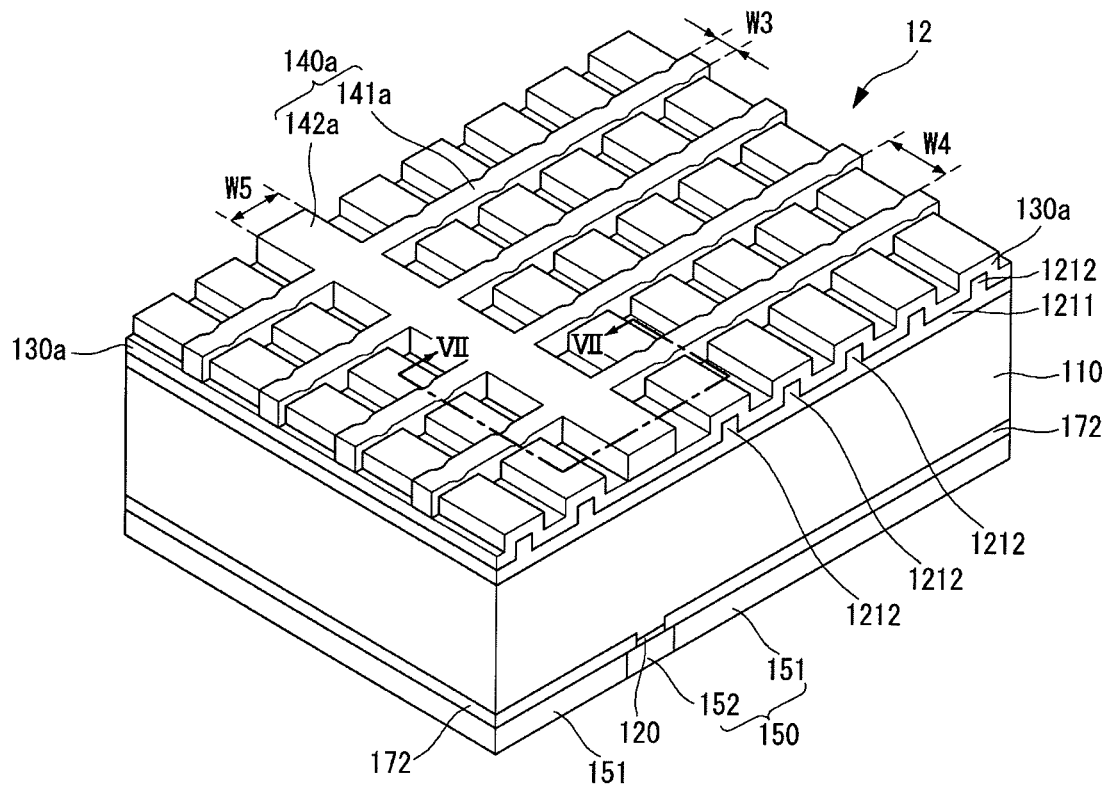
FIG. 6 is a partial sectional view of another example of a solar cell according to an example embodiment of the invention.
Figure 7:
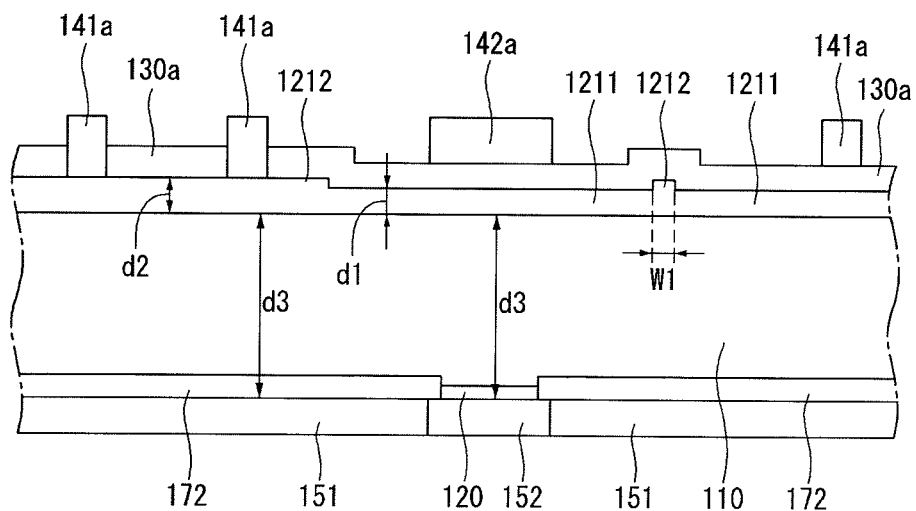
FIG. 7 is a cross-sectional view taken along line VII-VII of FIG. 6.

Next, referring to FIGS. 6 and 7, another example of the solar cell according to the embodiment of the invention is described. As compared with FIGS. 1 and 2, the elements performing the same operations are indicated with the same reference numerals, and the detailed description thereof is omitted.

A solar cell 12 shown in FIGS. 6 and 7 has the basic structure (or components) as the solar cell 11 of FIGS. 1 and 2.

That is, the solar cell 12 of the example according to the invention includes an emitter region 1211 and a plurality of highly doped regions 1212 which contain impurities of a second conductivity type and are positioned at (in) a front surface of a substrate 110, an anti-reflection layer 130a positioned on the emitter region 1211 and the plurality of highly doped regions 1212, a front electrode part (a first electrode part) 140a connected to the emitter region 1211 and the plurality of highly doped regions 1212 on the front surface of the substrate 110 and including a plurality of front electrodes (a plurality of first electrodes) 141a and a plurality of front bus bars (a plurality of first bus bars) 142a, a back surface field region 172 positioned at (in) a back surface of the substrate 110, and a back electrode part (a plurality of second electrode part) 150 positioned on the back surface of the substrate 110 and including a back electrode (a second electrode) 151 and a plurality of back bus bars (a plurality of second bus bars) 152.

However, as compared with the solar cell 11 of FIGS. 1 and 2, a formation position of the anti-reflection layer 130 in the solar cell 12 is different from that of the anti-reflection layer 130 in the solar cell 11 of FIGS. 1 and 2.

For example, in the solar cell 11 shown in FIGS. 1 and 2, the anti-reflection layer 130 is not positioned between the plurality of front electrodes 141 and the emitter region 1211 and between the plurality front bus bars 142 and the emitter region 1211, but positioned on portions of the emitter region 1211 and portions of the highly doped regions 1212 except the remaining portion of the emitter region 1211 and the highly doped regions 1212 connected to the front electrode part 140.

However, in the solar cell 12 of this example, the anti-reflection layer 130a is positioned on the emitter region 1211 and portions of the highly doped regions 1212 except where the highly doped regions 1212 crosses the plurality of front electrodes 141a and contacts the plurality of front electrodes 141a. Thereby, the anti-reflection layer 130a is positioned on the entire emitter region 1211 and the portions of the highly doped regions 1212 where the highly doped regions 1212 are not crossing the plurality of front electrodes 141a.

Thus, the front electrode part 140a includes different contact positions of the emitter region 1211 and the highly doped regions 1212 as compared to those of the front electrode part 140 of the solar cell 11 shown in FIGS. 1 and 2.

That is, the front bus bars 142a that crosses the plurality of front electrodes 141a of the front electrode part 140a and connects to the plurality of front electrodes 141a at crossings with the plurality of front electrodes 141a are actually positioned on the anti-reflection layer 130a instead of being connected to the emitter region 1211, and the plurality of front electrodes 141a are positioned on the anti-reflection layer 130a except where they cross the plurality of highly doped regions 1212. Accordingly, as described above, the front electrodes 141a of the front electrode part 140a contact the highly doped regions 1212 only where they cross the highly doped regions 1212. Except for the above difference, the front electrode part 140a of the solar cell 12 is equal to the front electrode part 140 of the solar cell 11 shown in FIGS. 1 and 2.

Since the anti-reflection layer 130a is positioned on the entire emitter region 1211 and the portions of the highly doped regions 1212 except the remaining portion where the plurality of front electrodes 141a crosses the highly doped region 1212, a formation area of the anti-reflection layer 130a performing the passivation function increases. Thus, a loss amount of charges that disappear by the defects at or near the surfaces of the emitter region 1211 and the highly doped regions 1212 is largely reduced, and thereby, an efficiency of the solar cell 12 is improved.

A method for manufacturing the solar cell 12 overlaps with the method shown in FIGS. 5A to 5E. Thereby, the method for manufacturing the solar cell 12 is described with reference to FIGS. 8A, 8B, 9A, 9B as well as FIGS. 5A to 5E.

As described referring to FIGS. 5A to 5D, an emitter region 1211 and a plurality of highly doped regions 1212 are formed at (in) the substrate 110, and an anti-reflection layer 130 is formed on the emitter region 1211 and the highly doped regions 1212.

Figure 8A:
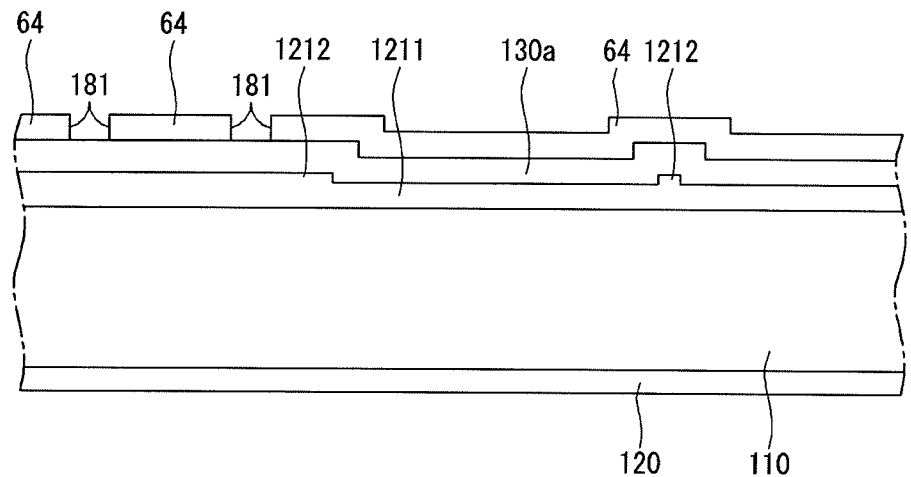
FIGS. 8A and 8B, and 9A and 9B are sectional views showing processes for manufacturing the solar cell shown in FIGS. 6 and 7.

Next, as shown in FIG. 8A, an etch protection layer 64 is formed on the anti-reflection layer 130. The etch protection layer 64 includes a plurality of openings 181 exposing portions of the anti-reflection layer 130. A magnitude (a diameter or width) of each opening 181 may be equal to or less than a magnitude (or width) of each of overlapping portions of the highly doped regions 1212 and a plurality of front electrodes 141. The etch protection layer 64 may be selectively formed on desired portions of the anti-reflection layer 130 by a screen printing method or a photolithography method.

Next, by etching a front surface portion of the substrate 110, portions of the anti-reflection layer 130 which is not protected by the etch prevention layer 64 and exposed through the plurality of openings 181 are removed, to complete an anti-reflection layer 130a exposing portions of the highly doped regions 1212.

Figure 8B:
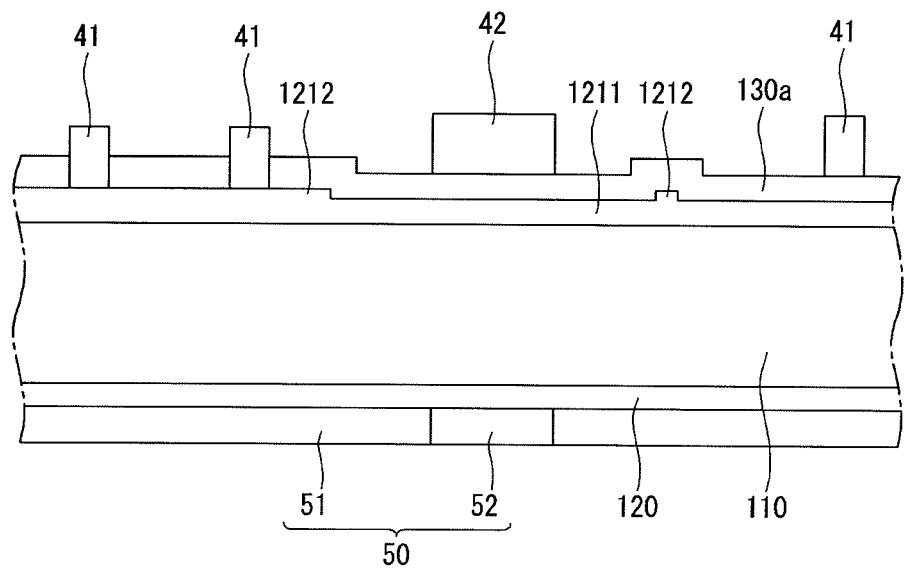

As described referring to FIG. 5E, in a similar manner, a front electrode part pattern 40 including a front electrode pattern 41 and a front bus bar pattern 42 is selectively or partially formed on the anti-reflection layer 130a and formed on the exposed portions of the highly doped regions 1212, and a back electrode part pattern 50 including a back electrode pattern 51 and a back bus bar pattern 52 is formed on a back surface of the substrate 110 as shown in FIG. 8B.

Next, by performing a thermal process to the substrate 110 with the patterns 40 and 50, formed are a front electrode part 140a including the plurality of front electrodes 141a partially (or locally) contacting the highly doped regions 1212 and positioned on the anti-reflection layer 130a and a plurality of front bus bars 142a connected to the plurality of front electrodes 141a and positioned on the anti-reflection layer 130a, a back electrode part 150 including a back electrode 151 connected to the substrate 110 and a plurality of back bus bars 152 connected to the back electrode 151 and the substrate 110, and a back surface field region 172 disposed at (in) a portion of the substrate 110 and contacting the back electrode 151.

In this instance, since the portions of the anti-reflection layer 130a, are removed to expose the portions of the highly doped regions 1212, and thereby, the front electrode pattern 41 is positioned on the exposed portions of the highly doped regions 1212, it is not necessary that the front electrode pattern 41 penetrates the anti-reflection layer 130a for contacting the plurality of front electrodes 141a and the highly doped regions 1212. Thus, since the thermal process for forming the front electrode part 140a and the back electrode part 150 may be performed at a lower temperature than for the other embodiment, the deterioration or the physical characteristic variation of the substrate 110 or elements formed on (at) the substrate 110 due to the thermal process is reduced or prevented.

In an alternative method, by using two different pastes for the front electrode part 140a, portions of the front electrode part 140a are in contact with the highly doped regions 1212, and the remaining portion of the front electrode part 140a is positioned on the anti-reflection layer 130a.

Figure 9A:
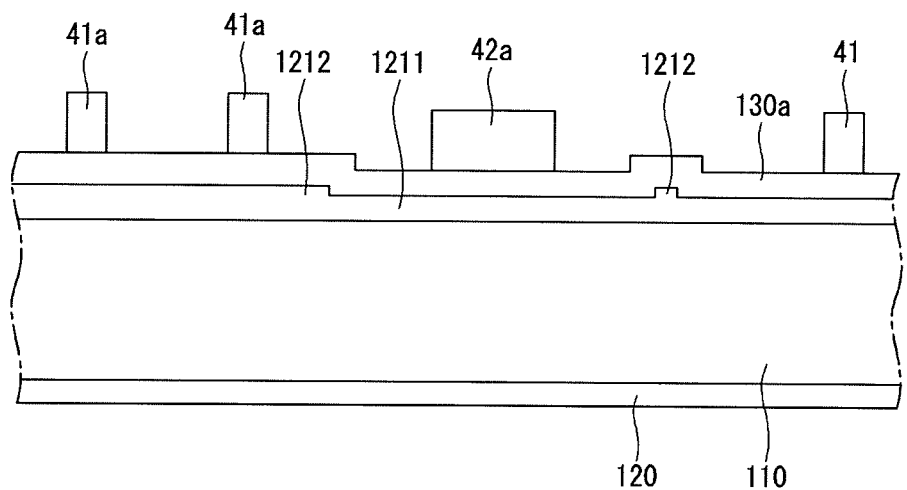
Figure 9B:
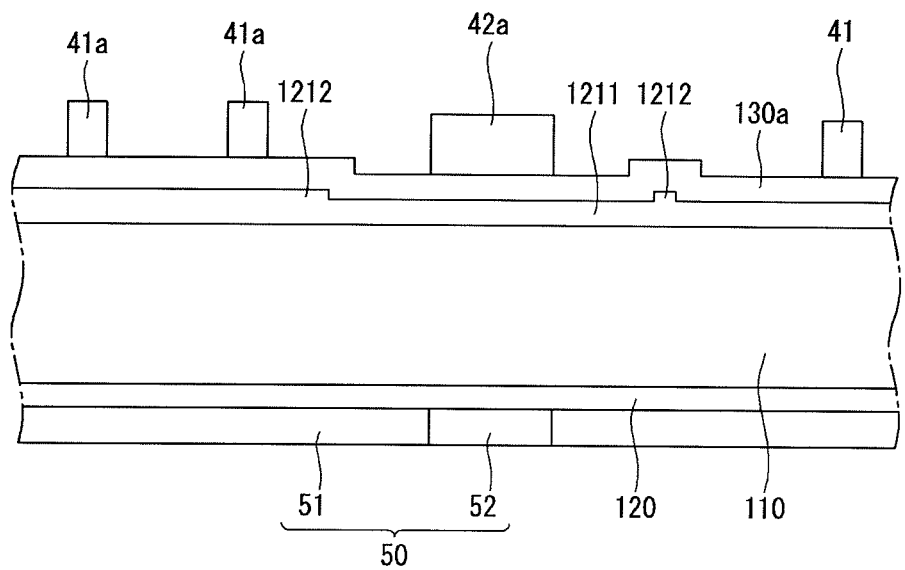

That is, as described above, after forming an emitter region 1211 and a plurality of highly doped regions 1212, and forming an anti-reflection layer 130 on the emitter region 1211 and the highly doped regions 1212, as shown in FIG. 9A, a first paste is selectively or partially (or locally) applied on the anti-reflection layer 130 and dried, to form a plurality of contact patterns 41a. Positions on which the first paste is applied correspond to overlapping positions (crossings) of the plurality of highly doped regions 1212 and the plurality of front electrodes 141a.

Next, a second paste is applied on portion of the anti-reflection layer 130 on which the first paste is not applied and dried, to form a front electrode pattern and a front bus bar pattern 42a, to thereby complete a front electrode part pattern. The front electrode pattern contact the contact patterns 41a.

A content of a glass frit including an etching material (for example, PbO) contained in the first pastes is different from that contained in the second paste. For example, the content of the glass frit contained in the first paste is an amount that is more than that contained in the second paste. Thereby, since the second paste contains the etching material equal to or less than a predetermined content (or amount) or does not contain the etching material at all, the second paste does not influence or affect an underlying layer (an underlying element) and thus, the underlying layer (the underlying element) to the second paste is not etched by the second paste.

Unlike the example, when the front electrode pattern is formed by using the second paste, the second paste may be applied on the contact patterns 41a.

Next, after forming a back electrode pattern and a back bus bar pattern on a back surface of the substrate 110, a thermal process is performed on the substrate 110 at about 750° C. to 800° C.

As described above, the contact patterns 41a made of the first paste penetrates portions of the anti-reflection layer 130 by the etching material to contact portions of the highly doped regions 1212. However the front electrode pattern and the front bus bar pattern 42a made of the second paste perform the chemical connection with the anti-reflection layer 130, and does not penetrate through portions of the anti-reflection layer 130. Further, by the thermal process, a back electrode 151 connected to the substrate 110, a plurality of back bus bars 152 connected to the substrate 110 and the back electrode 151, and a back surface field region 172 are formed at the back surface of the substrate 110.

Thus, each of the plurality of front electrode 141a is positioned on the anti-reflection layer 130a and partially contacts the portions of the highly doped regions 1212 through the anti-reflection layer 130a at the crossings to the highly doped regions 1212.

Next, referring to FIGS. 10 to 14, various examples of another embodiment of the invention are described.

As compared with the solar cells 11 and 12, the elements performing the same operations are indicated using the same reference numerals, and the detailed description thereof is omitted.

Figure 10:
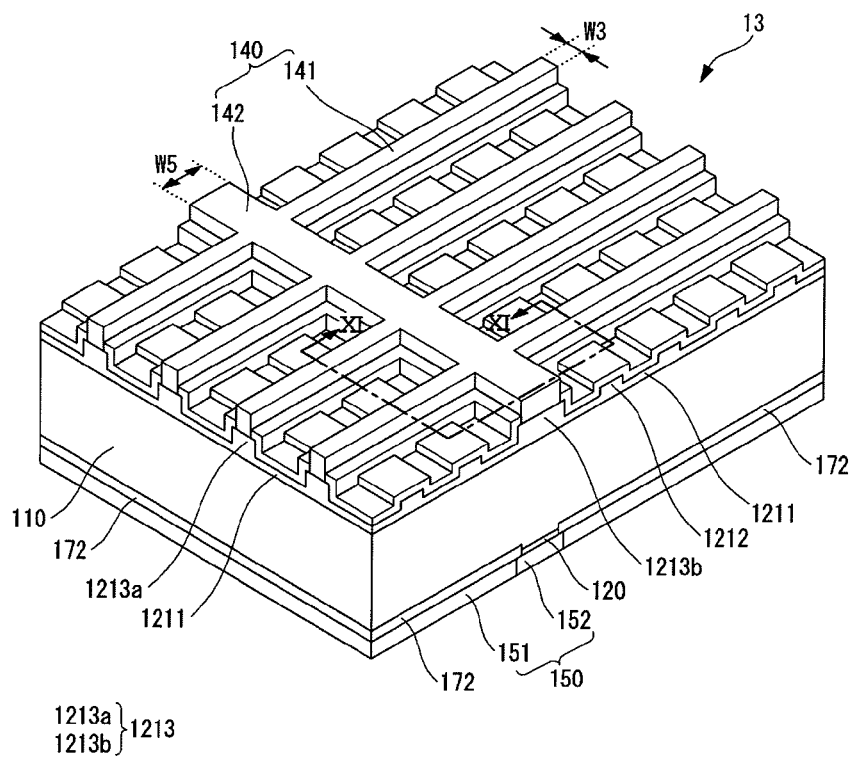
FIG. 10 is a partial sectional view of an example of a solar cell according to another example embodiment of the invention.
Figure 11:
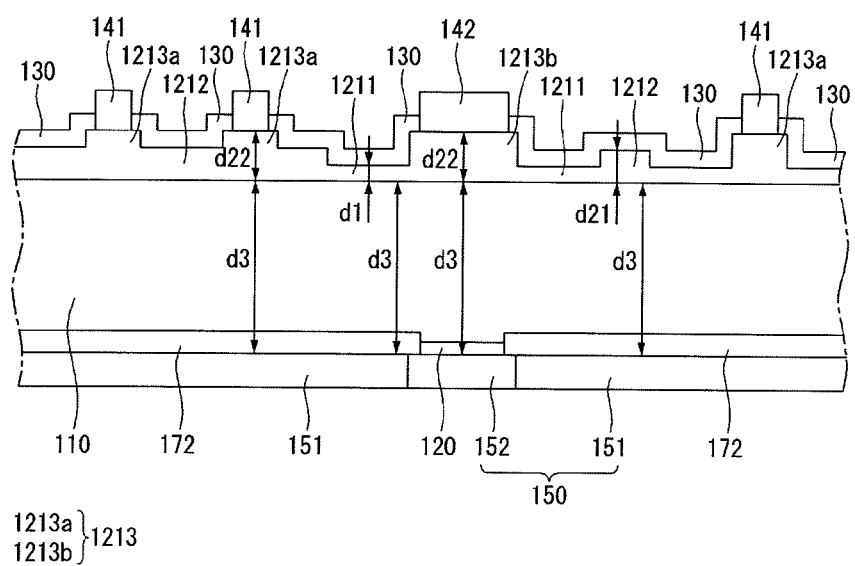
FIG. 11 is a cross-sectional view taken along line XI-XI of FIG. 10.
Figure 12:
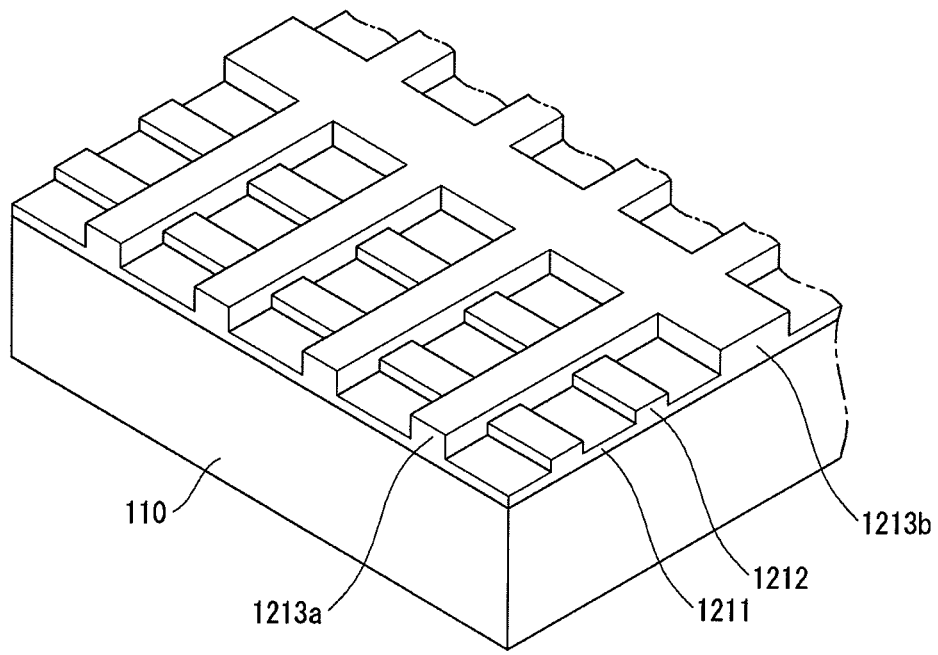
FIG. 12 is a partial sectional view of an emitter region, and first and second highly doped regions formed in an example of a solar cell according to another example embodiment of the invention.

As compared with the solar cell 11 shown in FIGS. 1 and 3, a solar cell 13 of FIGS. 10 to 12 further includes a highly doped region underlying a front electrode part 140.

In this instance, the highly doped regions directly underlying the front electrode part 140, that is, a plurality of front electrodes 141 and a plurality of front bus bars 142 and extending along the front electrode part 140 to connect to the front electrode part 140, may have an impurity doped concentration, an impurity doped thickness, and a sheet resistance different from those of the highly doped regions 1212.

That is, unlike the solar cell 11, the impurity doped regions 1211-1213 of the solar cell 12 are divided into an emitter region 1211 having a first impurity doped concentration, first highly doped regions 1212 each having a second impurity doped concentration greater than the first impurity doped concentration, and second highly doped regions 1213 each having a third impurity doped concentration greater than the second impurity doped concentration and underlying the entire front electrode part 140. Thus, the highly doped regions 1212 are referred to as the first highly doped regions and the highly doped regions 1213 are referred to as the second highly doped regions.

Thus, the emitter region 1211 has the smallest conductivity of the carriers from among the impurity doped regions 1211-1213 and the second highly doped region 1213 has the largest conductivity of the carriers from among the impurity doped regions 1211-1213.

In this instance, the impurity doped thickness of the emitter region 1211 is less than that of the first highly doped region 1212, and the impurity doped thickness of the first highly doped region 1212 is less than that of the second highly doped region 1213. Thus, the impurity doped thickness of the emitter region 1211 is the smallest and each of the second highly doped regions 1213 is the greatest of the impurity doped regions 1211-1213.

For example, the impurity doped thickness of the emitter region 1211 may be about 20 μm to 40 μm, the impurity doped thickness of the first highly doped region 1212 may be about 50 μm to 60 μm, and the impurity doped thickness of the second highly doped region 1213 may be about 500 μm to 1000 μm.

As compared with the solar cell 11, the solar cell 13 further includes the second highly doped regions 1213 as well as the first highly doped regions 1212. In this example, the first and second highly doped regions 1212 and 1213 function as semiconductor electrodes or semiconductor channels.

As above, because the impurity doped thicknesses of the emitter region 1211, the first and second highly doped regions 1212 and 1213 are different from each other, a shortest distance (a thickness) d1 from a front surface (an upper surface of the emitter region 1211) of the substrate 110 to a p-n junction surface (an lower surface of the emitter region 1211) (hereinafter, referred to as 'a first junction surface') between the first emitter region 1211 and the substrate 110 is different from a shortest distance (a thickness) d21 from a front surface (an upper surface of the first highly doped region 1212) of the substrate 110 to a p-n junction surface (a lower surface of the first highly doped region 1212) (hereinafter, referred to as 'a second junction surface') between the first highly doped region 1212 and the substrate 110, and is also different from a shortest distance (a thickness) d22 from a front surface (an upper surface of the second highly doped region 1213) of the substrate 110 and a p-n junction surface (a lower surface of the second highly doped region 1213) (hereinafter, referred to as 'a third junction surface') between the second highly doped region 1213 and the substrate 110. The distance d21 is also different from the distance d22. Thus, the distance d1 is the shortest and the distance d22 is the greatest. As shown in FIGS. 10 and 11, shortest distances (thicknesses) d3 from a back surface of the substrate 110 to the p-n junctions of the emitter region 1211 and the first and second highly doped regions 1212 and 1213 are equal to each other.

By the differences of the impurity doped thicknesses and the impurity doped concentrations of the emitter region 1211 and the first and second highly doped regions 1212 and 1213, the emitter region 1211 and the first and second highly doped regions 1212 and 1213 have different sheet resistances from each other. Thus, the emitter region 1211 having the smallest impurity doped thickness has the largest sheet resistance, and the second highly doped region 1213 having the largest impurity doped thickness has the smallest sheet resistance. In this example, the sheet resistance of the emitter region 1211 may be about 100 Ω/sq. to 140 Ω/sq., the sheet resistance of the first highly doped region 1212 may be about 60 Ω/sq. to 90 Ω/sq., and the sheet resistance of the second highly doped region 1213 may be about 10 Ω/sq. to 40 Ω/sq.

As shown in FIGS. 10 and 12, the second highly doped regions 1213 include a plurality of first portion 1213a and a plurality of second portions 1213b. The first portions 1213a extend in a direction crossing an extending direction of the second portions 1213b.

The first portions 1213a extend substantially parallel to one another in the direction crossing an extending direction of the first highly doped regions 1212, and the plurality of second portions 1213b extend substantially parallel to each other in a direction crossing the extending direction of the plurality of the first portions 1213a, that is, in the same direction as an extending direction of the plurality of first highly doped regions 1212.

The plurality of first portions 1213a directly contact the plurality of front electrodes 141 and the second portions 1213b directly contact the plurality of front bus bars 142.

Thus, the plurality of first portions 1213a are connected to the first highly doped regions 1212 at positions crossing the first highly doped regions 1212. Also, the plurality of first portions 1213a and the plurality of second portions 1213b are connected at their crossings.

Thereby, the plurality of the second highly doped regions 1213 are positioned in a lattice shape at the front surface of the substrate 110, as shown in FIG. 12.

In this example, a width of each first portion 1213a is different from that of each second portion 1213b, for example, the width of each first portion 1213a is less than that of each second portion 1213b.

Further, a width of each first highly doped region 1212 is different from that of the first portion 1213a of each second highly doped region 1213, for example, the width of the first highly doped region 1212 is less than that of the first portion 1213a of each second highly doped region 1213.

Figure 13:
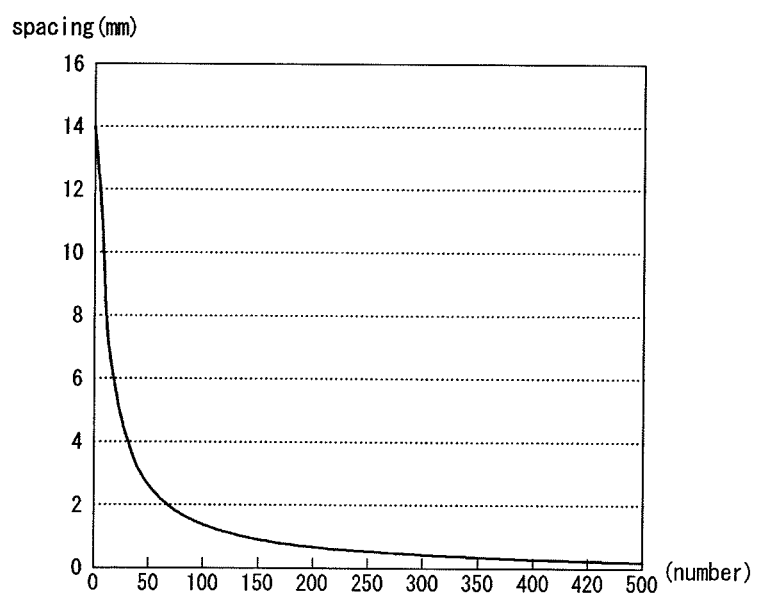
FIG. 13 is a graph illustrating a spacing change between two adjacent first highly doped regions in accordance with a number change of the first highly doped regions according to another example embodiment of the invention.

As an example, the width of each of the first highly doped regions 1212 may be about 30 μm to 40 μm, and a distance between two adjacent first highly doped regions 1212 may be about 0.3 mm to 3.0 mm. The number of the plurality of first highly doped regions 1212 may be about 50 to 400, and in this instance, a size of the substrate 110 may be 156 mm×156 mm. In this example, the distance between two adjacent first highly doped regions 1212 may be varied in accordance with the number of the first highly doped regions 1212. Thus, as shown in FIG. 13, as the number of the first highly doped regions 1212 increases, the distance between two adjacent first highly doped regions 1212 decreases.

Thereby, the emitter region 1211 is a remaining portion that excludes the first and second highly doped regions 1212 and 1213 of the impurity doped portion all having the impurities of the second conductivity type.

By the emitter region 1211 and the first and second highly doped regions 1212 and 1213 having different impurity doped concentrations and different impurity doped thicknesses from each other, electrons move toward the front surface of the substrate 110 on (at) which an n-type semiconductor region (for example, the emitter region 1211 and the first and second highly doped regions 1212 and 1213) is positioned, and holes move toward a p-type semiconductor region (for example, the back surface of the substrate 110).

When charges (e.g., electrons) move toward the emitter region 1211 and the first and second highly doped regions 1212 and 1213, the charges existing at the emitter region 1211 having the largest sheet resistance move to the first or second highly doped regions 1212 or 1213 having the sheet resistance less than that of the emitter region 1211 and poisoned at the nearest position to the charges. In this instance, since the impurity doped concentration of the emitter region 1211 is less than that of the first and second highly doped regions 1212 and 1213, a loss amount of charges that disappear due to the impurities during movement to the first and second highly doped regions 1212 and 1212 via the emitter region 1211 is reduced.

Since the conductivity of first highly doped regions 1211 is greater than that of the emitter region 1211, the charges that move from the emitter region 1211 to the first highly doped regions 1212 transfer along the first highly doped regions 1212 extending in a predetermined direction. When the charges that move along the first highly doped regions 1212 meet the first portions 1213a of the second highly doped regions 1213, the charges that move along the first highly doped regions 1212 transfer to the first portions 1213a of the second highly doped regions 1213 having the sheet resistance less than that of the first highly doped regions 1212. Then, the charges that move to the first portions 1213a transfer to the plurality of front electrodes 141 contacting the first portions 1213a and output to an external device through the front bus bars 142.

By the formation of the first and second highly doped regions 1212 and 1213, a charge movement distance to the first and second highly doped regions 1212 and 1213 having the relatively good conductivity as compared with the emitter region 1211 decreases. Thus, a loss amount of charges that disappear during movement to the first and second highly doped regions 1212 and 1213 decreases, and thereby, an amount of charges that move to the second highly doped regions 1213 largely increase.

As described above, since each second highly doped region 1213 connected to the front electrode part 140 outputting the charges to the external device has the largest conductivity, an amount of charges that move from the second highly doped regions 1213 to the front electrode part 140 further increases. Thus, an amount of charges transferred to the front electrode part 140 further increases than as compared to the solar cell 11.

When the sheet resistance of the emitter region 1211 is equal to or less than about 140 Ω/sq., or the impurity doped concentration of the emitter region 1211 is equal to or more than about 20 μm, charges are normally generated by the stable p-n junction. When the sheet resistance of the emitter region 1211 is equal to or more than about 100 Ω/sq., or the impurity doped concentration of the emitter region 1211 is equal to or less than about 40 μm, charges stably move to the first and second highly doped regions 1212 and 1213 without disturbance of charge movement by the impurities.

When the sheet resistance of the first highly doped region 1212 is equal to or less than about 90 Ω/sq., or the impurity doped thickness of the first highly doped region 1212 is equal to or more than about 50 μm, the conductivity of the first highly doped region 1212 is stably secured to increases an amount of charges moving to the first highly doped region 1212, and when the sheet resistance of the first highly doped region 1212 is equal to or more than 60 Ω/sq., or the impurity doped thickness of the first highly doped region 1212 is equal to or less than about 60 μm, the conductivity of the first highly doped region 1212 is stably secured to increase an amount of charges moving to the first highly doped region 1212, an amount of light absorbed in the first highly doped region 1212 is reduced, and thereby, an amount of light incident on the substrate 110 increases.

When the sheet resistance of the second highly doped region 1213 is equal to or less than about 40 Ω/sq., or the impurity doped thickness of the second highly doped region 1213 is equal to or more than about 500 μm, the conductivity of the second highly doped region 1213 is stably secured to increase an amount of charges moving to the highly doped region 1212, and when the sheet resistance of the second highly doped region 1213 is equal to or more than 10 Ω/sq., or the impurity doped thickness of the second highly doped region 1213 is equal to or less than about 1000 μm, an amount of light absorbed in the second highly doped region 1213 is reduced and thereby, an amount of light incident on the substrate 110 increases.

When the number of the plurality of first highly doped regions 1212 is equal to or more than 50, a charge transfer efficiency by the first highly doped regions 1212 functioning as the semiconductor electrodes is stably obtained, and when the number of the plurality of first highly doped regions 1212 is equal to or less than 400, the stable charge transfer efficiency is obtained without the loss amount of charges due to an area of the highly doped region being increased by the first highly doped regions 1212.

As described above, since the plurality of front electrodes 141 contact the first portions 1213a of the second highly doped regions 1213, and the plurality front bus bars 142 contact the second portions 1213b of the second highly doped regions 1213, the charges that move to the second highly doped regions 1213 transfer to the plurality of front electrodes 141 or the plurality front bus bars 142, and then are output to the external device through the plurality front bus bars 142.

In this example, since the plurality of front electrodes 141 contact the second highly doped regions 1213 having the largest conductivity of the impurity doped regions 1211-1213, a contact resistance of the plurality of front electrodes 141 and the impurity doped regions 1211-1213 further decreases than the plurality of front electrodes 141 that contact the emitter region 1211 or the first highly doped regions 1212. Thus, the amount of charges that move from the plurality of second highly doped regions 1213 to the plurality of front electrodes 141 further increases.

In this example, a width of each front electrode 141 may be 50 μm to 120 μm and a distance between two adjacent front electrodes 141 may be about 2.2 mm to 3.0 mm.

The number of the plurality of front electrodes 141 and the distance between two adjacent front electrodes 141 further increase as compared with when the plurality of first highly doped region 1212 are not formed.

By the first and second highly doped regions 1212 and 1213, the charge movement distance from the emitter region 1211 to the first and second highly doped regions 1212 and 1213 or the front electrode part 140 is reduced.

Thus, even though a distance between two adjacent first portions 1213a of the second highly doped regions 1213 considering the reduced charge movement distance is increased, an amount of charges moving from the first portions 1213a of the second highly doped regions 1213 to the plurality of front electrodes 141 is not decreased. As described, by the function of the plurality of first highly doped regions 1212, an amount of charges moving from the first portions 1213a of the second highly doped regions 1213 to the plurality of front electrodes 141 increases.

When the distance between two adjacent first portions 1213a of the second highly doped regions 1213 is increased, a distance between two adjacent front electrodes 141 positioned on the first portions 1213a of the second highly doped regions 1213 also increases.

Since the plurality of front electrodes 141 contain a metal, the plurality of front electrodes 141 do not transmit light, and thereby, as a formation areas of the plurality of front electrodes 141 increases, a light incident area of the substrate 110 decreases.

However, when the distance between the two adjacent front electrodes 141 is increased and thereby, the number of the plurality of front electrodes 141 is reduced, the light incident area increases to increase a light amount incident on the substrate 110 of the solar cell 13. Thereby, an efficiency of the solar cell 13 increases.

In this example, since only the anti-reflection layer 130 is positioned on the plurality of first highly doped region 1212 except the portions crossing the second highly doped regions 1213, the light incident area of the substrate 110 is not substantially (or adversely) decreased by the formation of the first highly doped regions.

When the width W3 of the front electrode 141 is equal to or greater than about 50 μm, a line resistance of the front electrode 141 decreases and the conductivity of the front electrode 141 is stably secured. Hence, the movement of carriers is more stably performed, and the front electrode 141 is more easily manufactured. Further, when the width W3 of the front electrode 141 is equal to or less than about 120 μm, the incident area of light is stably secured and a reduction in a production amount of carriers resulting from a reduction in the incident area is reduced or prevented.

When the distance W4 between the two adjacent front electrodes 141 is equal to or greater than about 2.2 mm, the front electrode 141 stably collects the carriers because the incident area of light resulting from the front electrodes 141 is not greatly reduced. Further, when the distance W4 between the two adjacent front electrodes 141 is equal to or less than about 3.0 mm, the carriers do not move to the adjacent front electrodes 141 because of the distance W4 is longer than the movement distance of carriers, and the loss of carriers is reduced or prevented.

Since the width of each of the plurality of second highly doped regions 1213 is defined by widths of each front electrode 141 and each front bus bar 142 overlying each of the plurality of the second highly doped regions 1213, a width of each first portion 1213a of the second highly doped regions 1213 positioned under each front electrode 141 is less than a width of each second portion 1213b of the second highly doped regions 1213 positioned under each front bus bar 142. In this example, the width of each first portion 1213a of the second highly doped regions 1213 is equal to or greater than that of each front electrode 141, and the width of each second portion 1213b of the second highly doped regions 1213 is equal to or greater than that of each front bus bar 142.

In this example, the number of the first highly doped regions 1212 is changed in accordance with the distance between the front electrodes 141 and, for example, as the distance between the front electrodes 141 increases, the number of the first highly doped regions 1212 increases. That is, since the first highly doped regions 1212 function as the semiconductor electrodes transferring the charges, to reduce the number of front electrodes 141 by increasing the distance between the front electrodes 141 causing the reduction of the light incident area and compensate the charge movement distance increasing by the increased distance between the front electrodes 141, the number of the first highly doped regions 1212 not reducing the light incident area is increased. Thus, since the charge movement distance from the emitter region 1211 to the front electrodes 141 and the first highly doped regions 1212 decreases, the charges easily transfer from the emitter region 1211 and the first and second highly doped regions 1212 and 1213 to the front electrodes 141.

The number of the plurality of front electrodes 141 is about 50 to 70.

Figure 14:
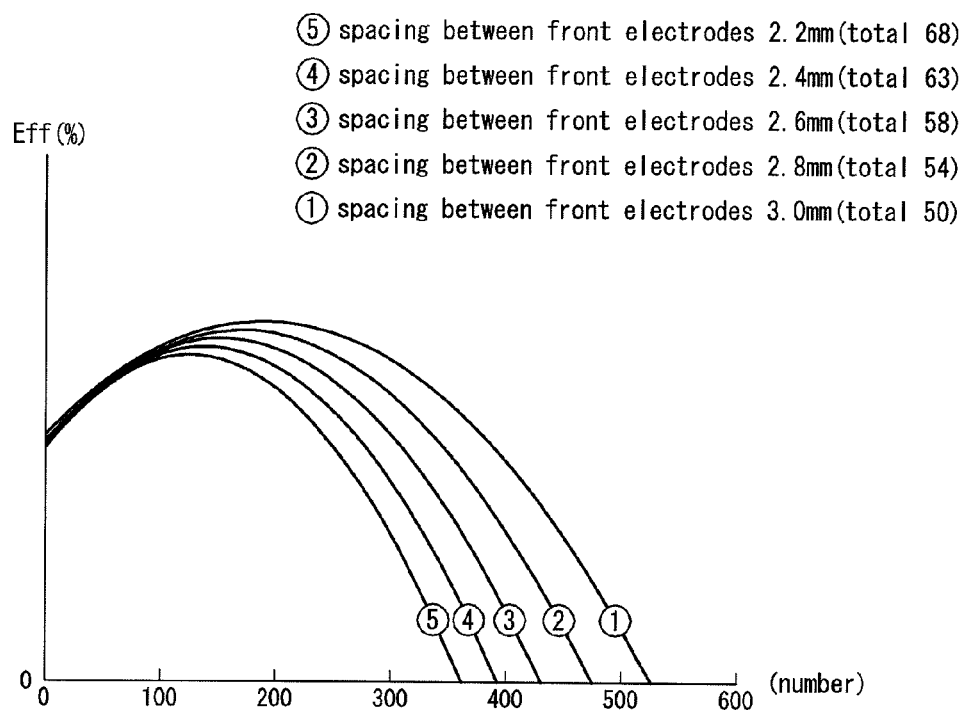
FIG. 14 is a graph illustrating an efficiency change of a solar cell in accordance with a number change of the first highly doped regions according to another example embodiment of the invention.

FIG. 14 shows graphs of an efficiency of the solar cell with respect to a variation of the number of the first highly doped regions 1212 when the distance between the front electrodes 141 is changed from 2.2 mm to 3.0 mm.

As shown in FIG. 14, as the distance between the front electrodes 141 increases, the number of the first highly doped regions 1212 also increases, and when the number of the first highly doped regions 1212 is about 50 to 400, the efficiency of the solar cell is stably increased.

The plurality front bus bars 142, unlike the plurality of front electrodes 141, according to the example, contact only the second portions 1213b of the second highly doped regions 1213. Thus, the anti-reflection layer 130 is not positioned under the front bus bars 142.

In this instance, the plurality front bus bars 142 and the plurality of front electrodes 141 are placed on the same level layer (or are coplanar), and are electrically and physically connected to one another at crossings of the front electrodes 141 and the front bus bars 142.

Thereby, in the same manner as the second highly doped regions 1213, the front electrode part 140 is positioned in a lattice shape on (at or in) the front surface of the substrate 110.

Thus, the plurality front bus bars 142 collect charges collected by the plurality of front electrodes 141 as well as charges collected by the second portions 1213b of the second highly doped regions 1213 contacting the plurality front bus bars 142. In this instance, since an amount of charges moving to the plurality of front electrodes 141 by the collection of the first highly doped regions 1212 increases, an amount of charges collected by the plurality front bus bars 142 also increases.

Like the plurality of front electrodes 141, since the plurality front bus bars 142 also contact the second highly doped regions 1213 having the largest impurity doped concentration of the impurity doped regions 1211-1213, an amount of charges moving from the second highly doped regions 1213 to the plurality front bus bars 142 further increases.

As described referring to FIGS. 1 and 3, a width W5 of each front bus bar 142 is greater than a width W3 of each front electrode 141 and, in the example, each front bus bar 142 may have the width W5 of about 1.5 mm to 2 mm. A width of each first highly doped region 1212 is greater than the width W3 of each front electrode 141 and less than the width W5 of each front bus bar 142.

By the second highly doped regions 1213 directly contacting the front electrode part 140 as well as the first highly doped regions 1212, the charge movement distance moving to the front electrode part 140 is reduced, and thereby, the distance between the two adjacent front electrodes 141 is increased. Accordingly, the light incident area of the substrate 110 increases.

In addition, since the sheet resistance of the second highly doped regions 1213 transferring charges to the front electrode part 140 decreases and the impurity doped concentration of the second highly doped regions 1213 increases, the conductivity of the second highly doped regions 1213 increases and a contact resistance between the second highly doped regions 1213 and the front electrode part 140 decreases. Thus, an amount of charges transferred from the second highly doped regions 1213 to the front electrode part 140 increases.

As described referring to FIGS. 1 and 2, since the impurity doped concentration of the emitter region 1211 is reduced, when the charges move from the emitter region 1211 to the highly doped regions 1212, the loss amount of charges by the impurities at the emitter region 1211 during movement from the emitter region 1211 to the highly doped regions 1212 decreases.

Different from the FIGS. 10 to 12, the highly doped regions directly underlying the front electrode part 140, that is, a plurality of front electrodes 141 and a plurality of front bus bars 142, and extending along the front electrode part 140 to be connected to the front electrode part 140 may have the same impurity doped concentration, impurity doped thickness, and sheet resistance as those of the highly doped regions 1212.

In this instance, the highly doped regions 1212 of FIGS. 1 to 3 are further positioned under and extend along each front electrode 141 and thereby, the highly doped regions 1212 are connected to each front electrode 141 (that is, the entire front electrode 141). In addition, the highly doped regions 1212 are further positioned under and extend along each front bus bar 142 and thereby, the highly doped regions 1212 are connected to each front bus bar 142 (that is, the entire front bus bar 142).

Thereby, since a formation area of the highly doped region 1212 increases, the charge movement distances from the emitter region 1211 to the highly doped regions 1212 further decrease, and since the front electrode part 140 collecting charges contact the highly doped regions 1212 having a higher conductivity and a lesser contact resistance than the emitter region 1211, an amount of charges moving to the front electrode part 140 further increases.

The formation of the highly doped regions 1211 additionally underlying the front electrode part 140 may be formed by the processes of FIGS. 5A to 5E considering the formation position of the modified highly doped regions 1211.

A method for manufacturing the solar cell 13 shown in FIGS. 10 and 11 is described referring to FIGS. 15A to 15G. The descriptions for the same processes as FIGS. 5A to 5E, 8A and 8B, and 9A and 9B are omitted for sake of brevity.

An impurity doped region 120 is formed at (in) a substrate 110 by using a thermal diffusion method, etc., and by removing an oxide film (e.g., PSG or BSG). The impurity doped region 120 has a sheet resistance of about 10 Ω/sq. to 40 Ω/sq.

Figure 15A:
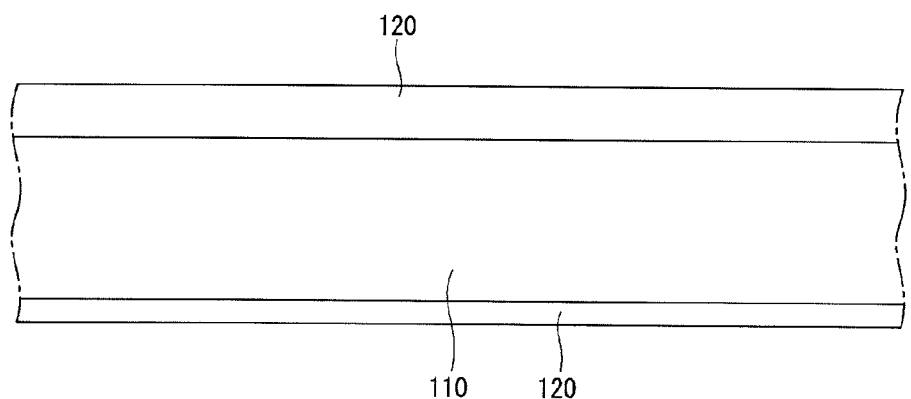
FIGS. 15A through 15G are sectional views showing processes for manufacturing the solar cell 1 according to an example embodiment of the invention.
Figure 15B:
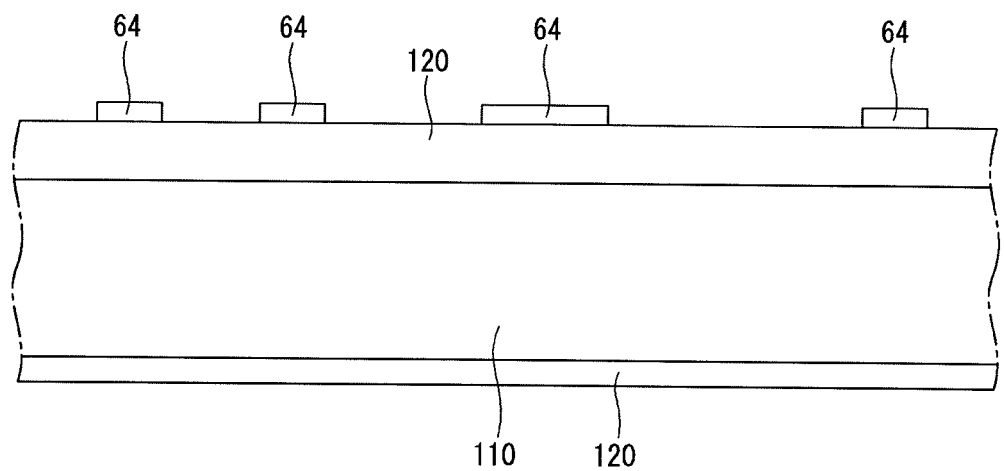
Figure 15C:
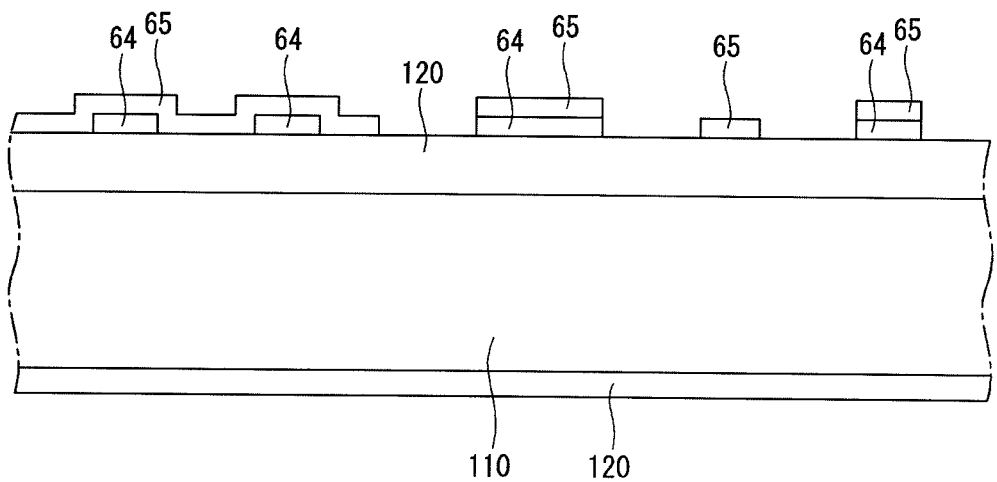

As shown in FIGS. 15B and 15C, a first etch prevention layer 64 is selectively or partially (or locally) formed on the impurity doped region 120 to expose portions of the impurity doped region 120 and then a second etch prevention layer 65 is formed on some of the exposed portions of the impurity doped region 120 and on the first etch prevention layer 64.

Figure 16:
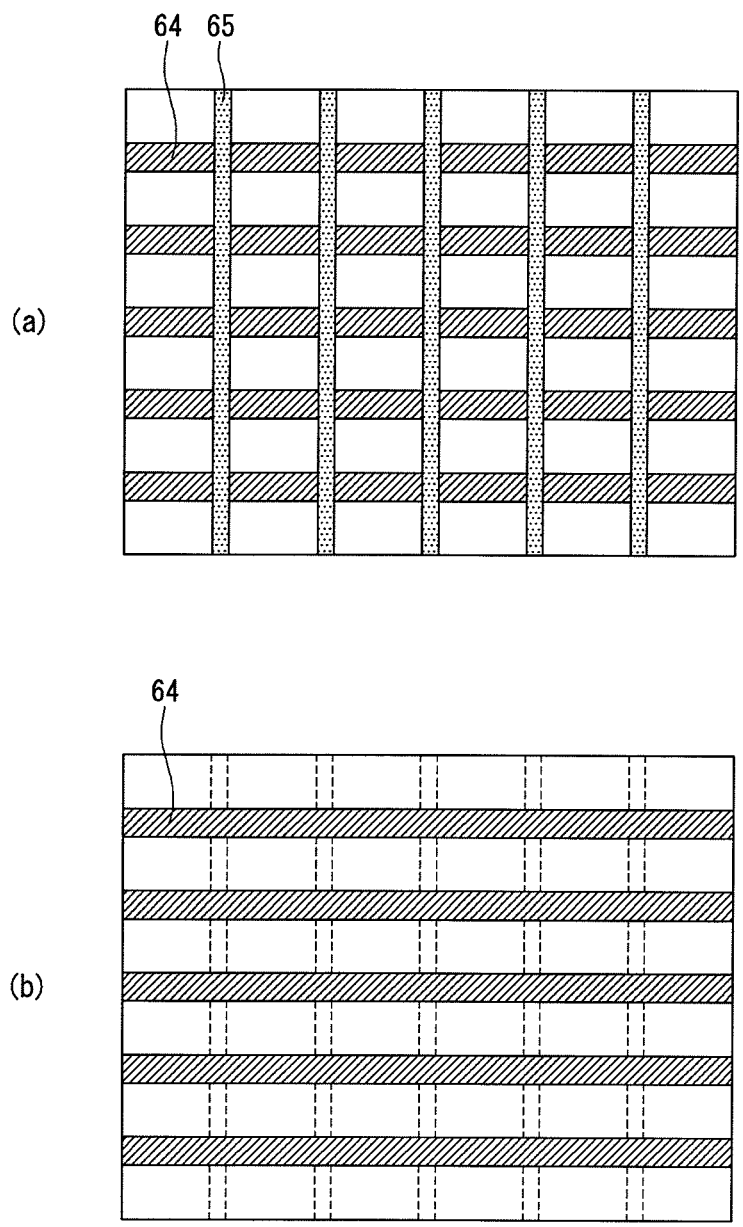
FIG. 16 schematically show patterns of an etch prevention layer positioned on an impurity doped region for an etch process to form an emitter region according to example embodiments of the invention.

When the first and second etch prevention layers 64 and 65 are formed on the impurity doped region 120, the first and second etch prevention layers 64 and 65 are formed in a lattice shape shown in (a) of FIG. 16. Formation positions of the first etch prevention layer 64 correspond to formation positions of the second highly doped regions 1213 shown in FIGS. 10 and 11, and formation positions of the second etch prevention layer 65 correspond to formation positions of the first highly doped regions 1212 shown in FIGS. 10 and 11.

Portions of the first etch prevention layer 64 are formed in a direction extending parallel to the second etch prevention layer 65. Thus, the first etch prevention layer 64 is positioned on the impurity doped region 120 in a lattice shape extending in directions crossing each other and the second etch prevention layer 65 is positioned on the impurity doped region 120 in a stripe shape extending in one direction.

The first and second etch prevention layers 64 and 65 may be formed by a screen printing method or a photo lithography method, etc.

Figure 15D:
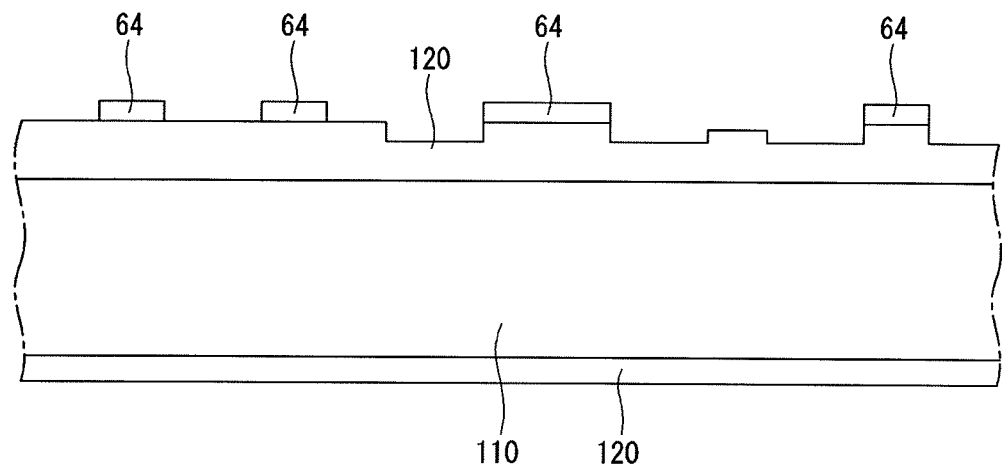

As shown in FIG. 15D, by using the second and first etch prevention layers 65 and 64 as a mask, the front surface portion of the substrate 110 is immersed into an etchant to remove the exposed portions of the impurity doped region 120 through the second etch prevention layer 65. Thus, an impurity doped region 120a having an impurity doped thickness less than that of the impurity doped region 120 is formed. Next, the second etch prevention layer 65 is removed by using a cleaning liquid, etc.

Thereby, the first etch prevention layer 64 remains on the impurity doped region 120 which has the shape shown in (B) of FIG. 16. As described above, the first etch prevention layer 64 includes the portions extending in the same direction as the extending direction of the second etch prevention layer 65.

Figure 15E:
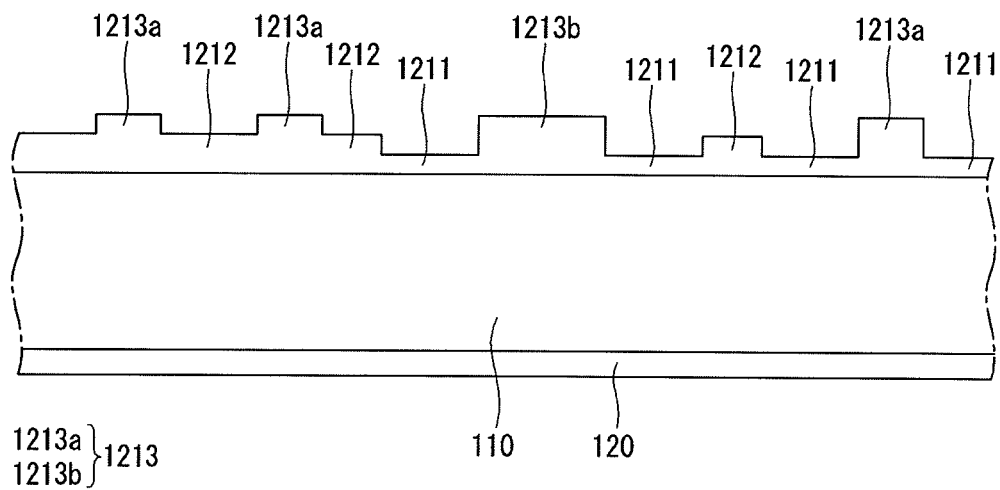

Next, as shown in FIG. 15E, by using the first etch prevention layer 64 as a mask, portions of the impurity doped region 120 and the impurity doped region 120a which are exposed through the first etch prevention layer 64 are etched, and then the first etch prevention layer 64 on the impurity doped region 120 is removed by using a cleaning liquid, etc.

Thus, a portion of the impurity doped region 120 on which the first and second etch prevention layers 64 and 65 are not positioned is etched twice, and thereby, is formed as the emitter region 1211 having the thinnest thickness, and portions of the impurity doped region 120 on which only the second etch prevention layer 65 is positioned are etched once, and thereby, are formed as a plurality of first highly doped regions 1212 having a thickness greater than that of the emitter region 1211. Portions of the impurity doped region 120 on which the first etch prevention layer 64 are positioned are not etched, and thereby, are formed as a plurality of second highly doped region 1212 having the thickest thickness.

Thereby, by the two etching processes using the first and second etch prevention layers 64 and 65, the emitter region 1211 and first and second highly doped regions 1212 and 1213 are formed each having different impurity doped thicknesses, impurity doped concentrations, and sheet resistances from each other.

The plurality of first highly doped regions 1212 extend substantially parallel to one another in a predetermined direction at a distance therebetween. The plurality of second highly doped regions 1213 extend substantially parallel to one another in a predetermined direction at a distance therebetween and include a plurality of first portion 1213a and a plurality of second portions 1213b. The first portions 1213a extend in a direction crossing an extending direction of the second portions 1213b. The portions of the first etch prevention layer 64 extending in crossing direction to the second etch prevention layer 65 are formed as the first portions 1213a of the second highly doped regions 1213, and the portions of the first etch prevention layer 64 extending in the same direction as the second etch prevention layer 65 are formed as the second portions 1213b, of the second highly doped regions 1213.

In an alternative example, a back surface portion as well as the front surface portion of the substrate 110, that is, the entire substrate 110 may be immersed into the etchant to remove portions of the impurity doped region 120. In this instance, a separate etch prevention layer is formed on the back surface of the substrate 110 not requiring the etching. In addition, the emitter region 1211 and the first and second highly doped regions 1212 and 1213 may be formed by a dry etching method instead of the wet etching method.

Figure 15F:
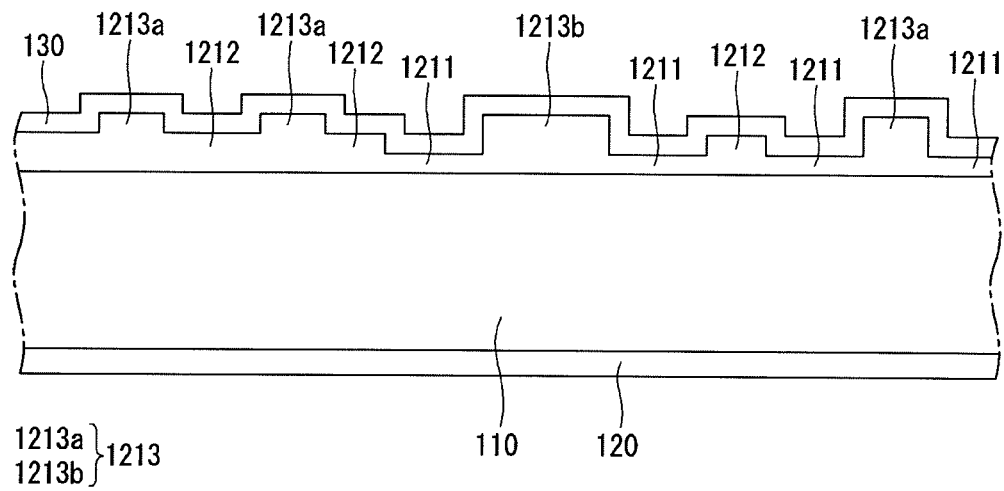

Next, as described similarly with reference to FIG. 5D, the anti-reflection layer 130 is formed on the emitter region 1211 and the first and second highly doped regions 1212 and 1213 positioned at the front surface of the substrate 110 as shown in FIG. 15F.

Figure 15G:
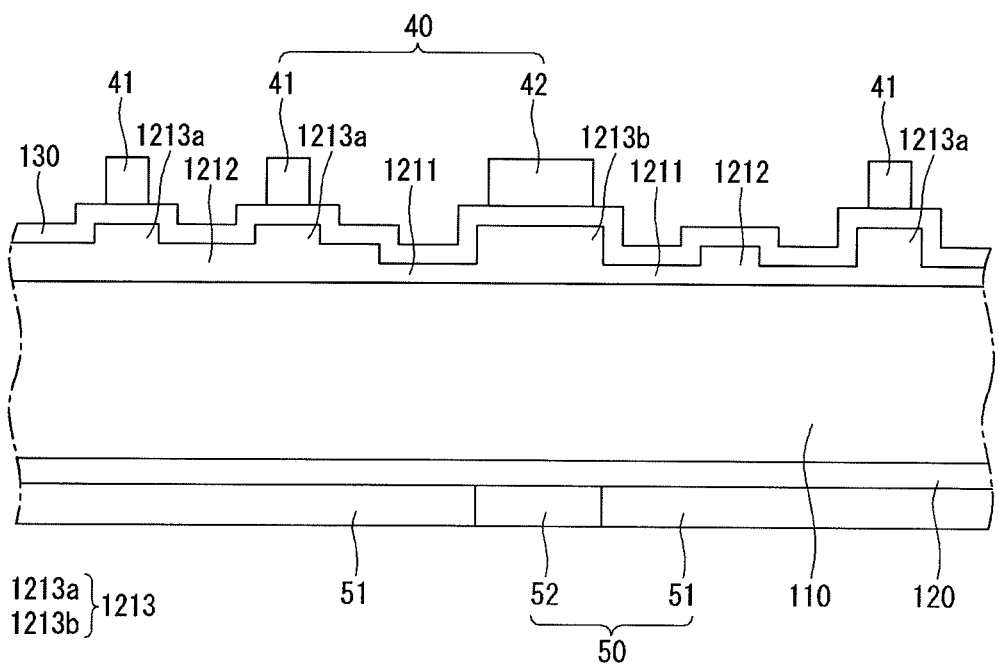

Next, in a similar manner as FIG. 5E, a front electrode part pattern 40 having a front electrode pattern 41 and a front bus bar pattern 42, and a back electrode part pattern 50 having a back electrode pattern 51 and a back bus bar pattern 52 are printed on the front and back surfaces of the substrate 110, respectively and dried as shown FIG. 15G.

Next, a thermal process is applied to the substrate 110 equipped with the front electrode part pattern 40 and the back electrode part pattern 50 at a temperature of about 750° C. to 800° C. Accordingly, formed for a front electrode part 140 are a plurality of front electrodes 141 and a plurality of front electrode bus bars 142 which are connected to the first portions 1213a and second portions 1213b of the second highly doped regions 1213, respectively, a back electrode part 150 of a back electrode 151 connected electrically to the substrate 110 and a plurality of back electrode bus bars 152 connected to the substrate 110 and the back electrode 151, and a back surface electric field region 172 disposed in (at) the back surface of the substrate 110 contacting the back electrode 151 as shown in FIGS. 10 and 11.

Next, an edge isolation process is performed to complete a solar cell 13.

Figure 17:
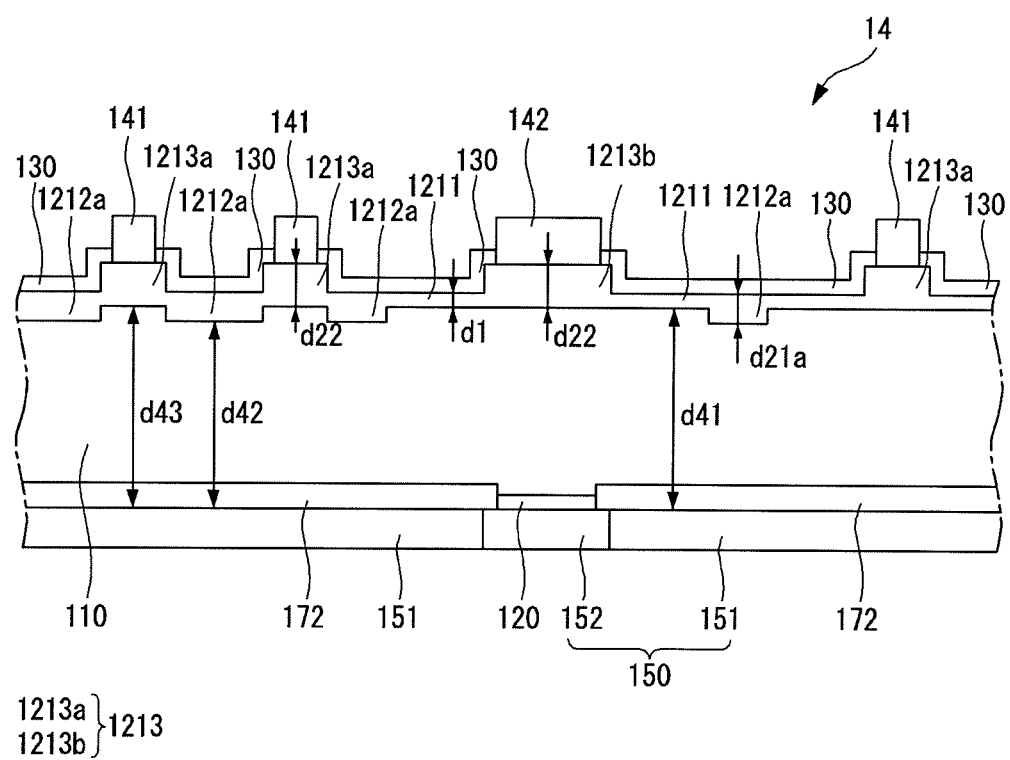
FIG. 17 is a partial cross-sectional view of another example of a solar cell according to another example embodiment of the invention.
Figure 18:
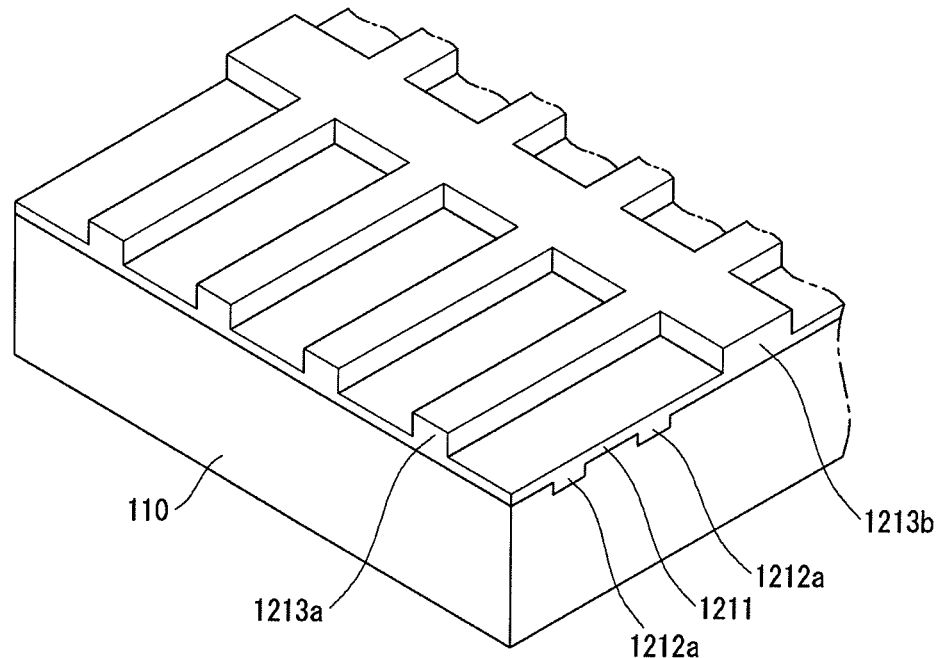
FIG. 18 is a partial sectional view of an emitter region, and first and second highly doped regions formed in another example of a solar cell according to another example embodiment of the invention.

Next, referring to FIGS. 17 and 18, another example of a solar cell according to an embodiment of the invention is described.

A solar cell 14 shown in FIG. 17 has the same structure as the solar cell 13 shown in FIGS. 10 and 11 except for the first highly doped regions 1212. Thus, a partial perspective view is omitted, and FIG. 17 is a cross-sectional view taken along line XI-XI of FIG. 10. As compared with FIGS. 10 and 11, the elements performing the same operations are indicated with the same reference numerals, and the detailed description thereof is omitted.

The solar cell 14 of FIG. 17 includes an emitter region 1211 and first and second highly doped regions 1212a and 1213 having each different impurity doped thicknesses d1, d21a and d22, impurity doped concentrations and sheet resistances from each other. In this instance, since the emitter region 1211 has the smallest impurity doped thickness and each of the second highly doped regions 1213 has the largest impurity doped thickness, the emitter region 1211 has the smallest impurity doped concentration and each of the second highly doped regions 1213 has the largest impurity doped concentration, and the emitter region 1211 has the greatest sheet resistance and each of the second highly doped regions 1213 has the smallest sheet resistance.

P-n junction surfaces (first and third junction surfaces) of the emitter region 1211 and the second highly doped regions 1213 are collinear, and thereby, positioned on the same line parallel to the back surface of the substrate 110. Thus, the p-n junction surface of the emitter region 1211 is collinear with the p-n junction surface of the second highly doped region 1213. However, a p-n junction (a second junction surface) of the first highly doped region 1212a and the first and second junction surfaces are positioned on the different lines.

Each of the second highly doped regions 1213 is projected from a contact surface of the emitter region 1211 and the anti-reflection layer 130 toward the anti-reflection layer 130, but each of the first highly doped regions 1212a is projected from the first or second junction surface toward the back electrode 151. Further, a thickness (or a height) d41 from the back surface of the substrate 110 to the first junction surface is equal to a thickness (or a height) d43 from the back surface of the substrate 110 to the third junction surface, but a thickness d42 from the back surface of the substrate 110 to the second junction surface is different from the thickness d41, d43 from the back surface of the substrate 110 and the first or third junction surface. That is, as shown in FIGS. 17 and 18, the thickness d42 is less than the thickness d41 and d43.

As shown in FIG. 18, the first highly doped regions 1212a extend in a crossing direction to the first portions 1213a of the second highly doped regions 1213, and extend parallel to the second portions 1213b of the second highly doped regions 1213.

Like the first highly doped regions 1212 of FIGS. 10 and 11, the first highly doped regions 1212a function as semiconductor electrodes.

The first highly doped regions 1212a may be formed by a process such as laser beam irradiation method, an impurity film or an ion implantation method, etc., which is different from the method for forming the emitter region 1211 and the second highly doped regions 1213.

Figure 19A:
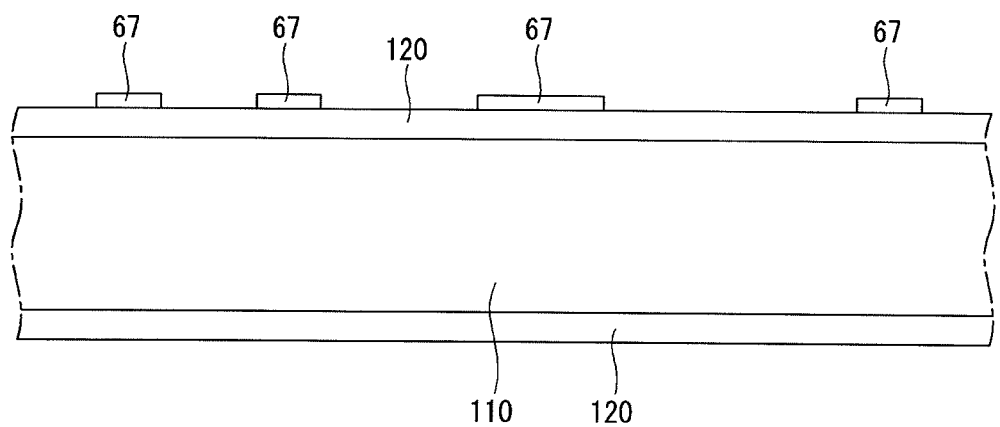
FIGS. 19A to 19C, 20A and 20B, and 21A and 21B are sectional views showing various processes for manufacturing an emitter region and first and second highly doped regions of a solar cell according to an example embodiment of the invention.
Figure 19B:
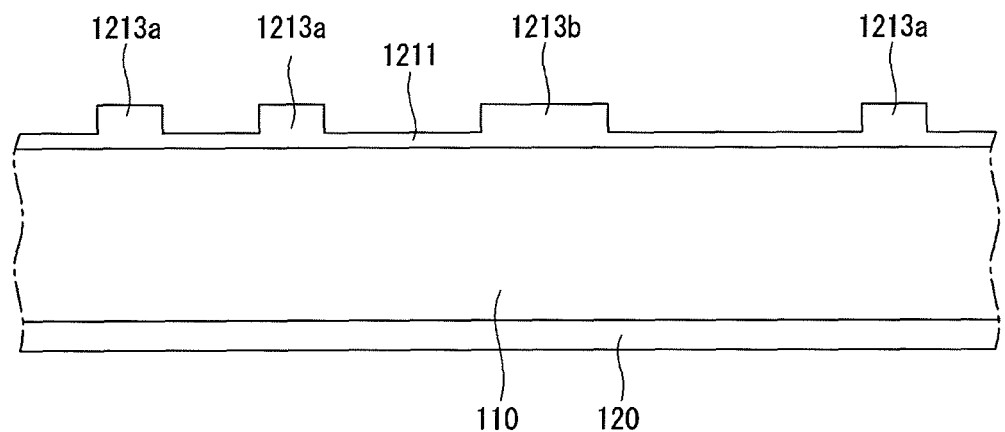
Figure 19C:
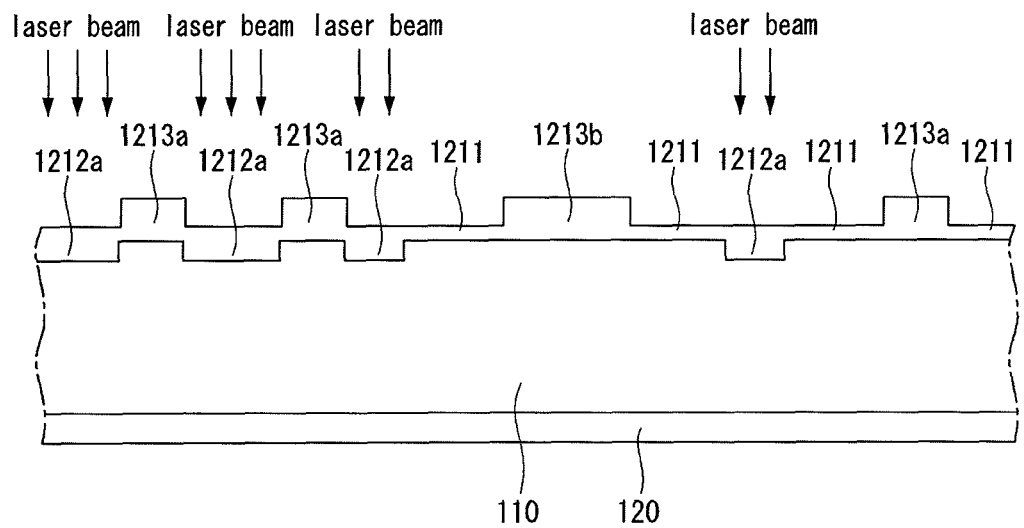

Next, referring to FIGS. 19A to 19C as well as FIGS. 15A to 15G, a method for forming the emitter region 1211 and the first and second highly doped regions 1212a and 1213 by using the laser irradiation method is described.

In a similar manner as described referring FIGS. 15A and 15B, after forming an impurity doped region 120 at (in) a substrate 110, an etch prevention layer 67 is selectively or partially formed on a front surface of the substrate 110 as shown in FIG. 19A. Formation positions of the etch prevention layer 67 correspond to formation positions of the second highly doped regions 1213.

Next, as shown in FIG. 19B, a front surface of the substrate 110 on which the etch prevention layer 67 is formed is exposed to an etchant to remove a desired thickness portions of the impurity doped region 120 on which the etch prevention layer 67 is not formed and to thereby form an impurity doped region having different impurity doped thicknesses. In this instance, the portions of the impurity doped region 120 on which the etch prevention layer 67 is positioned are not etched function as second highly doped regions 1213, and the portions of the impurity doped region 120 on which the etch prevention layer 67 is not positioned and are etched function as an emitter region 1211. Thereby, the emitter region 1211 and the second highly doped regions 1213 each having different impurity doped thicknesses are formed.

Next, laser beams are irradiated on portions of the emitter region 1211 to form the portions of the emitter region 1211 as the first highly doped regions 1212a and to complete the remaining portion of the emitter region 1211 on which the laser beams are not irradiated as the emitter region 1211. That is, the portion of the emitter region 1211 on which the laser beams are irradiated are changed into the first highly doped regions 1212a having the impurity doped thickness and the impurity doped concentration greater than that of the emitter region 1211. Thereby, the laser beams are irradiated only on formation positions of the first highly doped regions 1212a. Thus, in this instance, the emitter region 1211 and the first and second highly doped regions 1212a and 1213 are formed by an etch-back process using the etch protection layer 67 and the laser beam irradiation method.

When forming the first highly doped regions 1212a by using the laser beams, only one etch prevention layer formation process is required for forming the emitter region 1211 and the second highly doped regions 1213. Thus, the processes for manufacturing the emitter region 1211 and the first and second highly doped regions 1212a and 1213 are simplified, and manufacturing time and cost are reduced.

Alternatively, the first highly doped regions 1212a may be formed using a paste (referred to as 'an impurity paste') containing impurities. For example, as shown in FIG. 19A, after forming an impurity doped region 120, and then forming an emitter region 1211 and second highly doped regions 1213 by using an etch-back process which have different impurity doped thickness and different impurity doped concentrations from each other, by using a screen printing method, the impurity paste is printed on portions of the emitter region 1211 to form an impurity film 20 and then the substrate 110 is heated. Then, the impurity film 20 is removed. The impurity paste contains the impurity of the same conductivity type as the impurity doped region 120, and the impurity film 20 is printed at positions at which the first highly doped regions 1212a are formed. The heating may be performed on only the impurity film 20 or on the entire substrate 110.

Figure 20A:
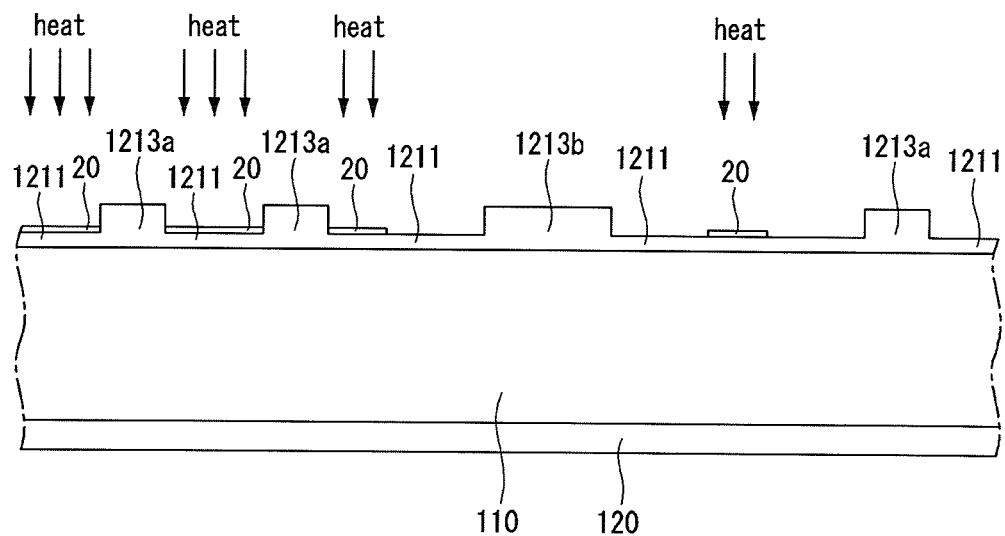
Figure 20B:
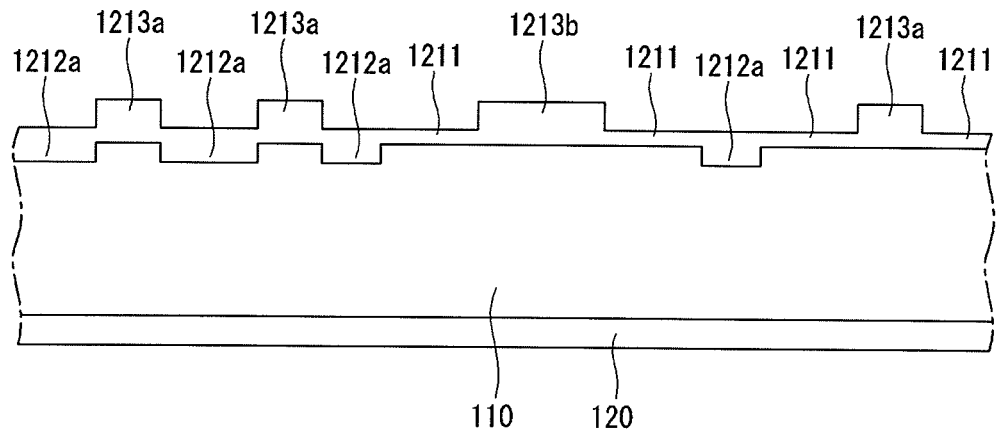

Thus, the impurities of a second conductivity type contained in the impurity film 20 are doped into the substrate 110 and thereby, the portions of the emitter region 1211 on which the impurity film 20 is printed are formed as the first highly doped regions 1212a and the remaining portion of the emitter region 1211 on which the impurity film is not printed is formed as the final emitter region 1211 as shown in FIG. 20B. The impurity doped concentration and impurity doped thickness of the first highly doped regions 1212a are greater than those of the emitter region 1211. In this example, the emitter region 1211 and the first and second highly doped regions 1212a and 1213 are formed by using the etch-back process and the impurity film 20 using the impurity paste. Instead of the impurity paste, an impurity ink may be applied on desired portions of the emitter region 1211 and dried to form the impurity film 20 for the first highly doped regions 1212a.

When the first highly doped regions 1212a are formed by using the impurity film 20 by the screen printing method, etc., only one etch prevention layer formation process is required for forming the emitter region 1211, and the first and second highly doped regions 1212a and 1213. Thus, the processes for manufacturing the emitter region 1211 and the first and second highly doped regions 1212a and 1213 are simplified.

In another example, the first highly doped regions 1212a may be formed by using the ion implantation method, etc. For example, after forming an impurity doped region 120 as shown in FIG. 19A, an emitter region 1211 and second highly doped regions 1213 are formed as shown in FIG. 19B.

Figure 21A:
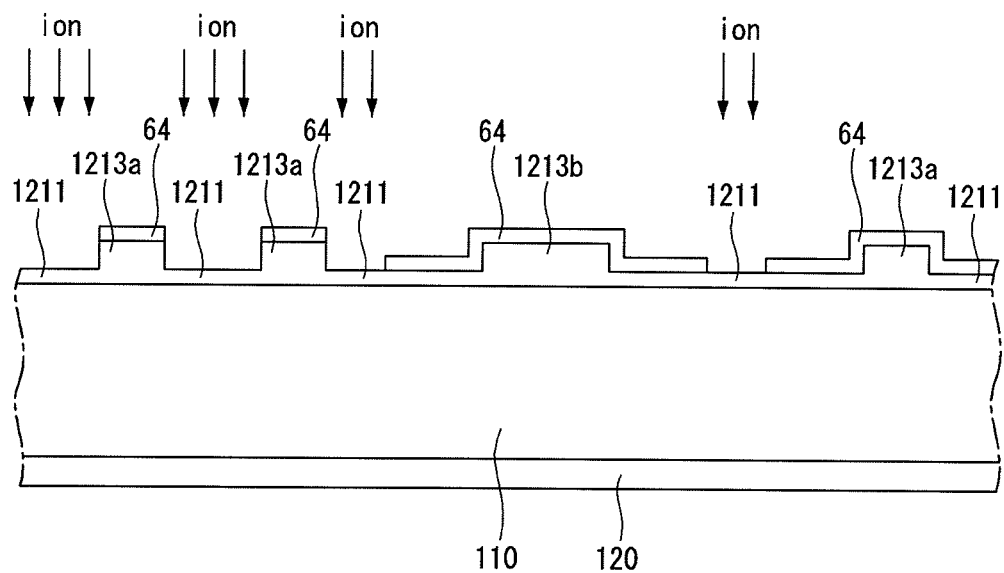

Next, as shown in FIG. 21A, a doping prevention layer 69 is formed on the second highly doped regions 1213a and 1213b and on portions of the emitter region 1211 at which the first highly doped regions 1212a are not formed, and impurities of the same conductivity type as the impurity doped region 120 are doped at a front surface of the substrate having the doping prevention layer 68 by using the ion implantation method, and then the doping prevention layer 69 is removed.

Figure 21B:
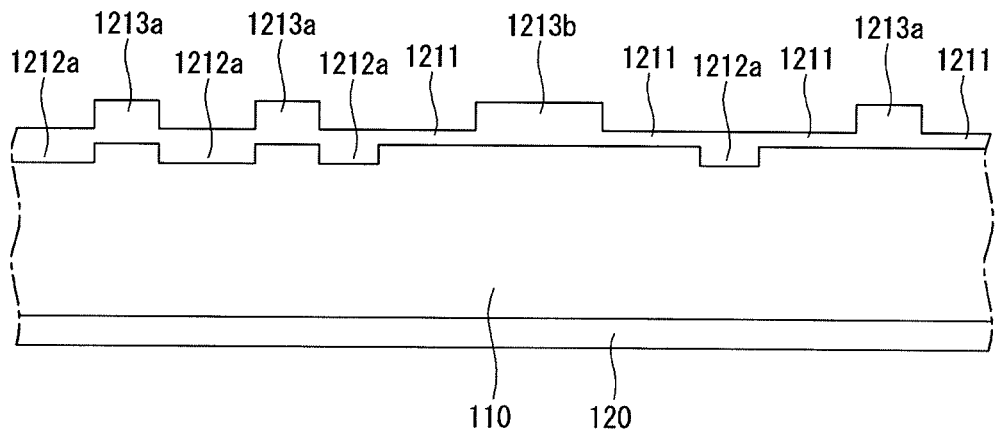

Thus, as shown in FIG. 21B, the impurities of a second conductivity type are doped into the remaining portion of the emitter region 1211 on which the doping prevention layer 69 is not formed and thereby, the remaining portion of the emitter region 1211 is formed as the first highly doped regions 1212a. As described, the portions of the emitter region 1211 on which the doping prevention layer 69 maintain the emitter region 1211 and the second highly doped regions 1213 underlying the doping prevention layer 69 also maintain the second highly doped regions 1213. Thereby, the emitter region 1211 and first and second highly doped regions 1212a and 1213 are formed by the etch-back process and the ion implantation method.

When the first highly doped regions 1212a are formed by the ion implantation method, the impurity doped concentration and the impurity doped thickness of the first highly doped regions 1212a are easily adjusted by controlling ion implantation speed, etc. Thereby, characteristics of the first highly doped regions 1212a are improved.

As described above, after forming the emitter region 1211 and the first and second highly doped regions 1212a and 1213 by using various method besides the etch-back process, as shown in FIGS. 15F and 15G, an anti-reflection layer 130, a front electrode part pattern 40 and a back electrode part pattern 50 are formed, and a thermal process is subjected to the substrate 110 to form the solar cell 14.

In the specification, the solar cells shown in FIGS. 1 and 2, 6 and 7, 10 and 11, and 17, an upper surface (a surface adjacent to a light incident surface) of the anti-reflection layer 130 has not a flat surface but an uneven surface under the influence of the emitter region 1211 and the highly doped regions 1212, 1212a and 1213. However, the upper surface of the anti-reflection layer 130 may be substantially flat by increasing a thickness of the anti-reflection layer 130 irrespective of the shape of a lower surface (a surface of the anti-reflection layer 130 contacting the emitter region 1211 and the highly doped region 1212, 1212a and 1213).

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
   a substrate of a first conductivity type;
   an emitter region which is positioned on an upper surface of the substrate, is doped with impurities of a second conductivity type opposite the first conductivity type, and has a portion having a first sheet resistance;
   an anti-reflection layer positioned on the emitter region;
   a plurality of first electrodes positioned on the upper surface of the substrate and connected to the emitter region, the plurality of first electrodes extending in a first direction parallel to each other;
   a first bus bar positioned on the upper surface of the substrate and connected to the emitter region, extending in a second direction crossing the first direction, and connected to the plurality of first electrodes at crossings of the plurality of first electrodes and the first bus bar,
   wherein the emitter region further includes a plurality of first highly doped regions which are positioned on the upper surface of the substrate, are doped with impurities of the second conductivity type, and having a second sheet resistance less than the first sheet resistance, and a plurality of second highly doped regions which are positioned under the plurality of first electrodes and the first bus bar, are doped with impurities of the second conductivity type, and have a third sheet resistance less than the second sheet resistance of the plurality of first highly doped regions; and
   a second electrode positioned on a lower surface of the substrate opposite the upper surface of the substrate and connected to the substrate,
   wherein the plurality of first highly doped regions extend in the second direction crossing along the extending first direction of the plurality of first electrodes, are connected to the plurality of first electrodes at crossings of the plurality of first electrodes and the plurality of first highly doped regions, and are positioned under the plurality of first electrodes,
   wherein the plurality of first highly doped regions are parallel to the first bus bar along the extending second direction of the first bus bar, are electrically connected to the first bus bar, and do not overlap each other,
   wherein the plurality of second highly doped regions positioned under the plurality of first electrodes are positioned along the extending first direction to be parallel to each other, and are directly connected to the plurality of first electrodes,
   wherein the plurality of second highly doped regions positioned under the first bus bar are positioned along the extending second direction, and are directly connected to the first bus bar,
   wherein an upper surface of the plurality of first highly doped regions is projected from an upper surface of the emitter region towards a light incident surface of the substrate,
   wherein a lower surface of the plurality of first highly doped regions has the same height as a lower surface of the emitter region,
   wherein a distance between the upper surface of the plurality of first highly doped regions and the lower surface of the substrate opposite the upper surface of the substrate is greater than a distance between the upper surface of the emitter region and the lower surface of the substrate, and
   wherein the lower surface of the substrate is a surface on which the second electrode is positioned.

2. The solar cell of claim 1, wherein the emitter region has a first impurity doped thickness, the plurality of first highly doped regions have a second impurity doped thickness greater than the first impurity doped thickness, and the plurality of second highly doped regions have a third impurity doped thickness greater than the second impurity doped thickness.

3. The solar cell of claim 2, wherein the first impurity doped thickness of the emitter region is about 20 μm to 40 μm, the second impurity doped thickness of the plurality of first highly doped regions is about 50 μm to 60 μm, and the third impurity doped thickness of the plurality of second highly doped regions is about 500 μm to 1000 μm.

4. The solar cell of claim 1, wherein the first sheet resistance of the emitter region is 100 Ω/sq. to 140 Ω/sq., the second sheet resistance of the plurality of first highly doped regions is 60 Ω/sq. to 90 Ω/sq., and the third sheet resistance of the plurality of second highly doped regions is 10 Ω/sq. to 40 Ω/sq.

5. The solar cell of claim 1, wherein the plurality of first electrodes are positioned on the anti-reflection layer except at the crossings of the plurality of first electrodes and the plurality of the first highly doped regions.

* * * * *